United States Patent
Kim et al.

(10) Patent No.: US 11,063,093 B2
(45) Date of Patent: Jul. 13, 2021

(54) ORGANIC LIGHT EMITTING DIODE DISPLAY DEVICE

(71) Applicant: Samsung Display Co., Ltd., Yongin-Si (KR)

(72) Inventors: Heena Kim, Hwaseong-si (KR); Myounggeun Cha, Seoul (KR); Sang Jin Park, Yongin-si (KR); Young Seok Baek, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/708,894

(22) Filed: Dec. 10, 2019

(65) Prior Publication Data

US 2020/0212126 A1  Jul. 2, 2020

(30) Foreign Application Priority Data

Dec. 26, 2018  (KR) .................. 10-2018-0169837

(51) Int. Cl.
 *H01L 27/32* (2006.01)
 *H01L 51/52* (2006.01)

(52) U.S. Cl.
 CPC ...... *H01L 27/3218* (2013.01); *H01L 27/3276* (2013.01); *H01L 51/5237* (2013.01)

(58) Field of Classification Search
 CPC .................. H01L 27/3276; H01L 27/3297
 See application file for complete search history.

(56) References Cited

U.S. PATENT DOCUMENTS

| 7,554,120 | B2 * | 6/2009 | Ishii | G02F 1/136209 257/72 |
| 9,853,067 | B2 | 12/2017 | Cai et al. | |
| 2006/0243977 | A1 * | 11/2006 | Yamasaki | H01L 27/124 257/59 |
| 2007/0195215 | A1 * | 8/2007 | Murade | G02F 1/1345 349/42 |
| 2008/0012812 | A1 * | 1/2008 | Kawata | G09G 3/3648 345/90 |
| 2008/0143664 | A1 * | 6/2008 | Nakagawa | G02F 1/136286 345/92 |

(Continued)

FOREIGN PATENT DOCUMENTS

| CN | 107219660 A | * | 9/2017 |
| KR | 1020170131768 A | | 11/2017 |
| KR | 101935929 B1 | | 1/2019 |

*Primary Examiner* — Michele Fan
(74) *Attorney, Agent, or Firm* — Cantor Colburn LLP

(57) ABSTRACT

An organic light emitting diode display device includes a substrate, a buffer layer, a first circuit structure, a sub-pixel structure, and a first signal wire. The substrate includes a display region including a plurality of sub-pixel regions and a peripheral region surrounding the display region. The buffer layer is disposed in the display region and peripheral region on the substrate. The first circuit structure is disposed in the peripheral region on the buffer layer. The sub-pixel structure is disposed in each of the sub-pixel regions on the first circuit structure. The first signal wire is disposed in the peripheral region between the substrate and the buffer layer, and overlaps the first circuit structure when viewed from a plan view in a thickness direction of the substrate.

17 Claims, 16 Drawing Sheets

(56) References Cited

U.S. PATENT DOCUMENTS

| | | | |
|---|---|---|---|
| 2011/0215337 A1* | 9/2011 | Egami | H01L 29/04 |
| | | | 257/72 |
| 2017/0192580 A1* | 7/2017 | Jung | G02F 1/134363 |
| 2018/0122827 A1* | 5/2018 | Park | G09G 3/36 |
| 2019/0013339 A1* | 1/2019 | Li | H01L 27/3213 |
| 2019/0181211 A1* | 6/2019 | Bae | G09G 3/3233 |

* cited by examiner

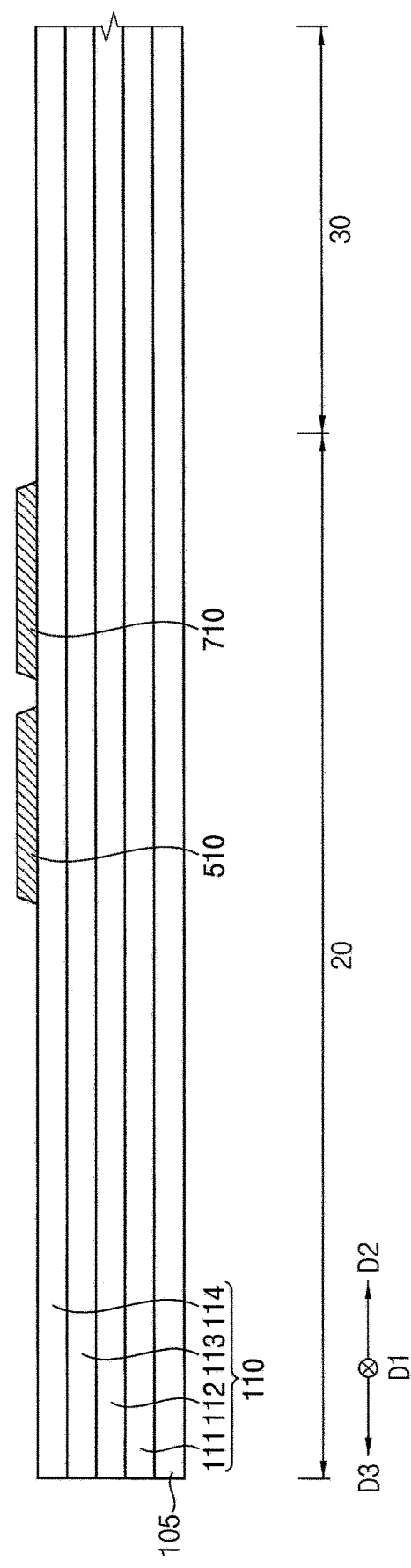

ORGANIC LIGHT EMITTING DIODE DISPLAY DEVICE

This application claims priority to Korean Patent Applications No. 10-2018-0169837, filed on Dec. 26, 2018, and all the benefits accruing therefrom under 35 U.S.C. § 119, the content of which in its entirety is herein incorporated by reference.

BACKGROUND

1. Field

Exemplary embodiments relate generally to an organic light emitting diode display device. More particularly, embodiments of the invention relate to an organic light emitting diode display device including a signal wire.

2. Description of the Related Art

A flat panel display ("FPD") device is widely used as a display device of an electronic device because the FPD device is lightweight and thin compared to a cathode-ray tube ("CRT") display device. The FPD device includes a liquid crystal display ("LCD") device and an organic light emitting diode ("OLED") display device.

An OLED display device may have a display region where an image is displayed and a peripheral region where a gate driver, a data driver, a plurality of signal wires, etc. are disposed. In such an OLED display device, the peripheral region may substantially surround the display region. A plurality of transistors may be disposed in the gate driver, and the signal wires (e.g., data signal wires) may be disposed adjacent to the gate driver.

SUMMARY

As the size and resolution of an organic light emitting diode ("OLED") display device increases, the number of the transistors and the data signal wires that are included in the gate driver disposed in the peripheral region (e.g., a dead space) may be relatively increased. In this case, an area of the peripheral region may be increased.

Exemplary embodiments provide an OLED display device including a signal wire.

According to an exemplary embodiment, an OLED display device includes a substrate, a buffer layer, a first circuit structure, a sub-pixel structure, and a first signal wire. In such an embodiment, the substrate has a display region including a plurality of sub-pixel regions and a peripheral region surrounding the display region. In such an embodiment, the buffer layer is disposed in the display region and peripheral region on the substrate. In such an embodiment, the first circuit structure is disposed in the peripheral region on the buffer layer. In such an embodiment, the sub-pixel structure is disposed in each of the sub-pixel regions on the first circuit structure. In such an embodiment, the first signal wire is disposed in the peripheral region between the substrate and the buffer layer, and overlaps the first circuit structure when viewed from a plan view in a thickness direction of the substrate.

In an exemplary embodiment, the OLED display device may further include a switching transistor disposed in the sub-pixel region on the buffer layer and a driving transistor spaced apart from the switching transistor.

In an exemplary embodiment, the switching transistor may include a first active layer disposed in the sub-pixel region on the substrate, a first gate electrode disposed on the first active layer, and first source and first drain electrodes disposed on the first gate electrode.

In an exemplary embodiment, the driving transistor may include a second active layer spaced apart from the first active layer, a second gate electrode disposed on the second active layer, and second source and second drain electrodes disposed on the second gate electrode.

In an exemplary embodiment, the first circuit structure may include a gate driver including a first transistor.

In an exemplary embodiment, the gate driver may provide a gate signal to the first gate electrode of the switching transistor.

In an exemplary embodiment, he OLED display device may further include a second circuit structure spaced apart from the first circuit structure in the peripheral region on the substrate.

In an exemplary embodiment, the second circuit structure may include a light emission driver including a second transistor spaced apart from the first circuit structure.

In an exemplary embodiment, the OLED display device may further include a second signal wire spaced apart from the first signal wire in the peripheral region between the substrate and the buffer layer. In such an embodiment, the second signal wire may overlap the second circuit structure when viewed from the plan view in the thickness direction of the substrate.

In an exemplary embodiment, the first signal wire may include a clock signal wire to which a clock signal is applied, and may provide the clock signal to the first and second circuit structures. In such an embodiment, the second signal wire may include a driving power supply wire to which a driving power supply is applied, and may provide the driving power supply to the first and second circuit structure.

In an exemplary embodiment, the OLED display device may further include a power supply wire spaced apart from the first circuit structure in the peripheral region on the buffer layer and a connection pattern disposed on the power supply wire.

In an exemplary embodiment, the power supply wire may be electrically connected to the sub-pixel structure through the connection pattern.

In an exemplary embodiment, the OLED display device may further include a block structure disposed in an outmost portion of the peripheral region on the substrate.

In an exemplary embodiment, the block structure may include a first block pattern disposed on the connection pattern and a second block pattern spaced apart from the first block pattern. In such an embodiment, the second block pattern may surround the first block pattern.

In an exemplary embodiment, the sub-pixel structure may include a lower electrode disposed on the substrate, a light emitting layer disposed on the lower electrode, and an upper electrode disposed on the light emitting layer. In such an embodiment, the upper electrode may be electrically connected to the connection pattern.

In an exemplary embodiment, the substrate may include a first organic layer, a first barrier layer disposed on the first organic layer, a second organic layer disposed on the first barrier layer, and a second barrier layer disposed on the second organic layer.

In an exemplary embodiment, the OLED display device may further include a thin film encapsulation structure disposed on the sub-pixel structure, and the thin film encapsulation structure may include a first thin film encapsulation layer, a second thin film encapsulation layer, and a third thin film encapsulation layer. In such an embodiment, the first thin film encapsulation layer may include an inorganic material having flexibility. In such an embodiment, the second thin film encapsulation layer may be disposed on the first thin film encapsulation layer, and may include an organic material having flexibility. In such an embodiment, the third thin film encapsulation layer may be disposed on the second thin film encapsulation layer, and may include an inorganic material having flexibility.

According to an exemplary embodiment, an OLED display device includes a substrate, a sub-pixel structure, a first circuit structure, and a signal wire. In such an embodiment, the substrate has a display region including a plurality of sub-pixel regions and a peripheral region surrounding the display region. In such an embodiment, the sub-pixel structure is disposed in each of the sub-pixel regions on the substrate. In such an embodiment, the first circuit structure is disposed in the peripheral region on the substrate. In such an embodiment, the signal wire is disposed in the peripheral region within the substrate, and overlaps the first circuit structure when viewed from a plan view in a thickness direction of the substrate.

In an exemplary embodiment, the substrate may include a plurality of layers, and the first signal wire may be interposed between the plurality of layers.

In an exemplary embodiment, the OLED display device may further include a switching transistor disposed in the sub-pixel region on the substrate and a driving transistor spaced apart from the switching transistor. In such an embodiment, the first circuit structure may include a gate driver including a first transistor, and the gate driver may provide a gate signal to a gate electrode of the switching transistor.

In such an embodiment, the OLED display device includes the first signal wire and the second signal wire that are disposed to overlap the first circuit structure and the second circuit structure, such that the OLED display device may relatively reduce a width of a bezel corresponding to a non-display region or may relatively increase an area of the display region.

BRIEF DESCRIPTION OF THE DRAWINGS

The above and other features of the invention will become more apparent by describing in detailed embodiments thereof with reference to the accompanying drawings, in which:

FIGS. 6 through 11 are cross-sectional views illustrating a method of manufacturing an OLED display device in accordance with an exemplary embodiment.

DETAILED DESCRIPTION

Figure 1A:
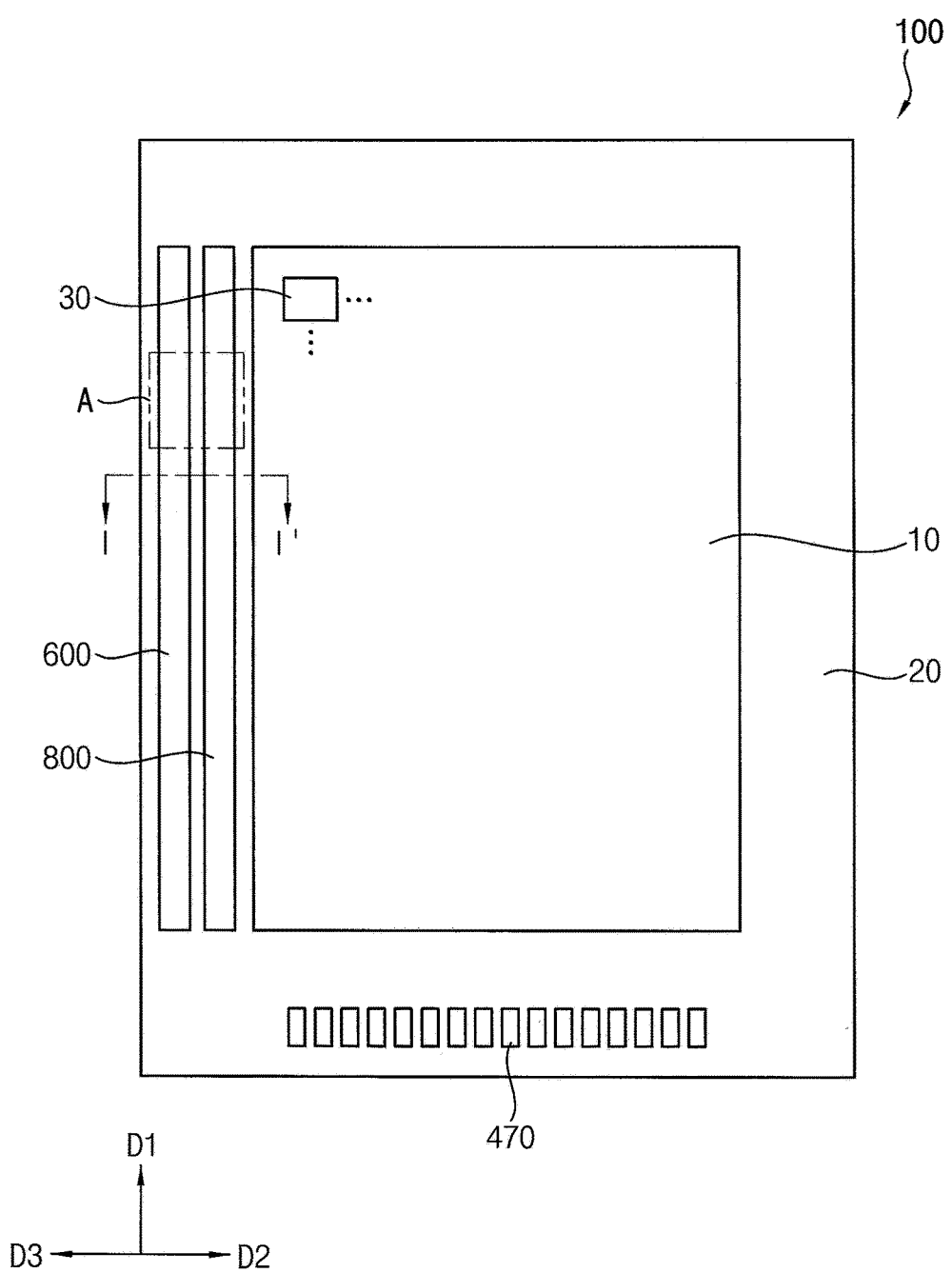
FIG. 1A is a plan view illustrating an organic light emitting diode ("OLED") display device in accordance with an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be explained in detail with reference to the accompanying drawings.

Figure 1B:
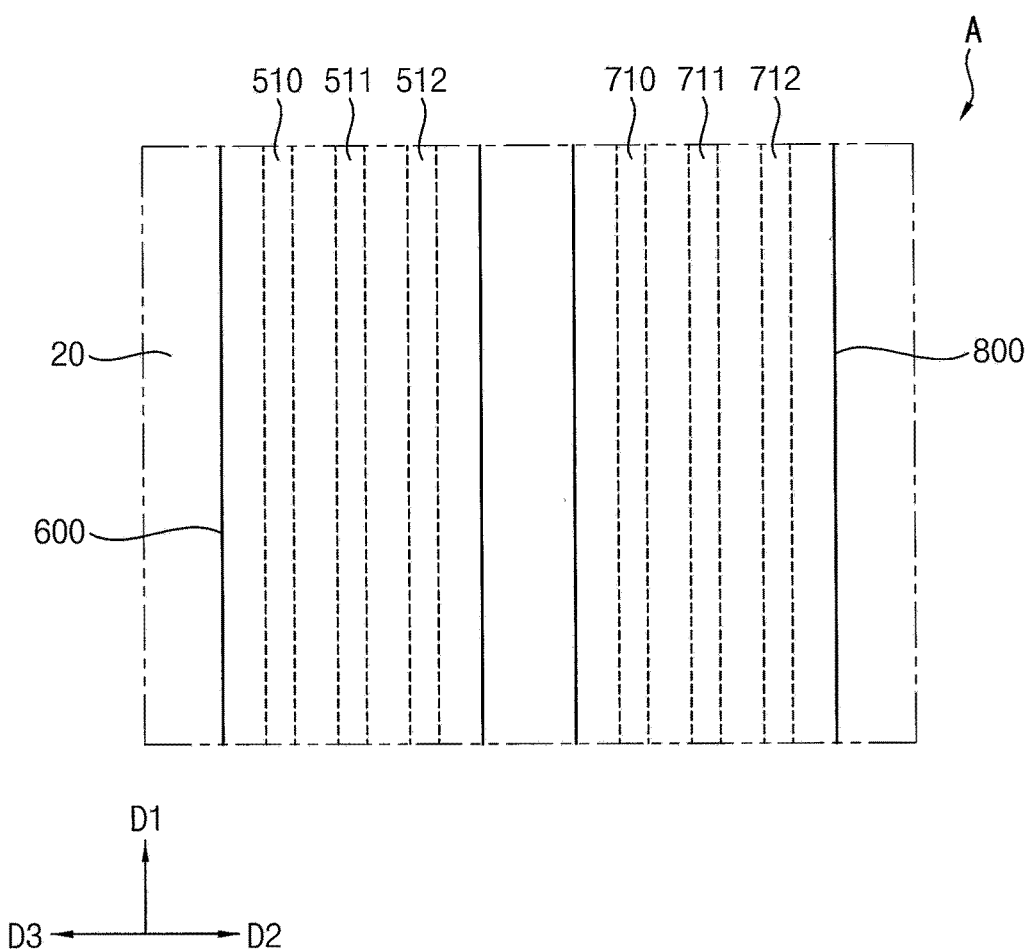
FIG. 1B is an enlarged partial plan view corresponding to a region 'A' of the OLED display device of FIG. 1A.
Figure 2:
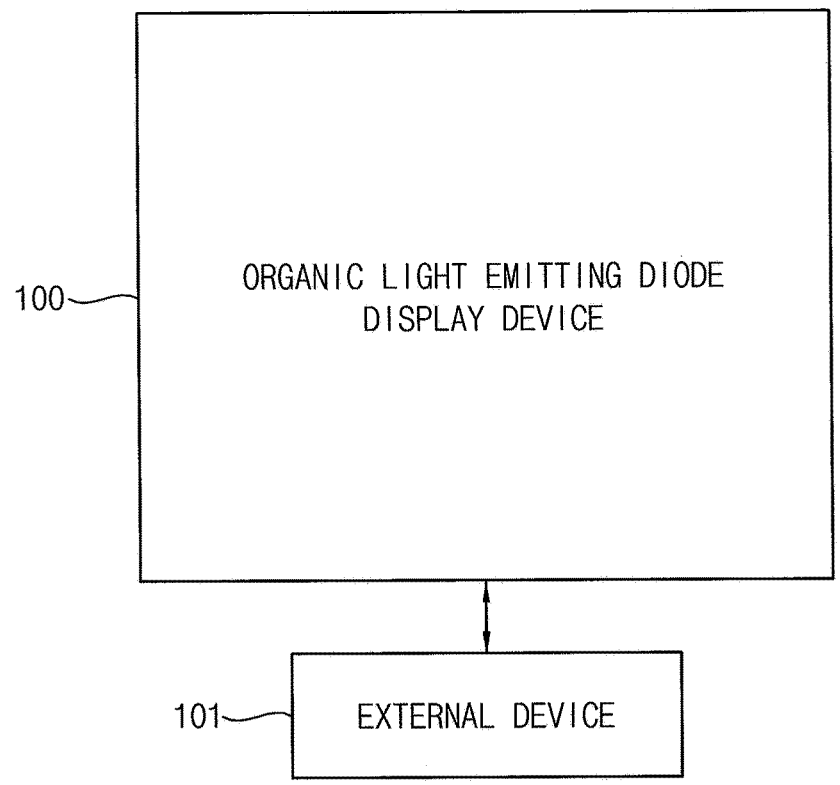
FIG. 2 is a block diagram illustrating an external device electrically connected to the OLED display device of FIG. 1A.

FIG. 1A is a plan view illustrating an organic light emitting diode ("OLED") display device in accordance with an exemplary embodiment, and FIG. 1B is an enlarged partial plan view corresponding to a region 'A' of the OLED display device of FIG. 1A. FIG. 2 is a block diagram illustrating an external device electrically connected to the OLED display device of FIG. 1A.

Referring to FIGS. 1 and 2, an exemplary embodiment of an OLED display device 100 may include a display region 10 and a peripheral region 20 surrounding the display region 10. In such an embodiment, the display region 10 may include a plurality of sub-pixel regions 30. The sub-pixel regions 30 may be arranged in the entire display region 10 in a matrix form.

A first circuit structure 800 and a second circuit structure 600 may be disposed in a side portion (e.g., a left of the display region 10) of the peripheral region 20, and the first circuit structure 800 may be disposed closer to the display region 10 than the second circuit structure 600. The first circuit structure 800 may include a plurality of gate states (e.g., a gate stage GST of FIG. 3A), and the second circuit structure 600 may include a plurality of light emission stages (e.g., a light emission stage EST). In an exemplary embodiment, as illustrated in FIG. 1B, first signal wires 710, 711, and 712 (e.g., a first signal wire 710 of FIG. 4) may be disposed under the first circuit structure 800, and second signal wires 510, 511, and 512 (e.g., a second signal wire 510 of FIG. 4) may be disposed under the second circuit structure 600. In such an embodiment, the first signal wires 710, 711, and 712 may include a clock signal wire, and the second signal wires 510, 511, and 512 may include a high power supply wire. In such an embodiment, a clock signal may be applied to the first signal wires 710, 711, and 712, and a high power supply may be applied to the second signal wires 510, 511, and 512. In such an embodiment, the first signal wires 710, 711, and 712 may electrically connect the first circuit structure 800 and the second circuit structure 600 to each other, and the second signal wires 510, 511, and 512 may electrically connect the first circuit structure 800 and the second circuit structure 600 to each other. In such an embodiment, the first signal wires 710, 711, and 712 may provide the clock signal to the first circuit structure 800 and the second circuit structure 600, and the second signal wires 510, 511, and 512 may provide the high power supply to the first circuit structure 800 and the second circuit structure 600.

In an exemplary embodiment, as shown in FIGS. 1A and 1B, each of the first signal wires and the second signal wires includes three wires, but not being limited thereto. In an exemplary embodiment, each of the first signal wires and the second signal wires may include at least one wire, e.g., one, two or four wires.

A plurality of pad electrodes 470 may be disposed in another side portion (e.g., a bottom or lower of the display region 10) of the peripheral region 20. Alternatively, the first circuit structure 800 and the second circuit structure 600 may be disposed in the peripheral region 20 at a right or a top of the display region 10. In an exemplary embodiment, the OLED display device 100 may further include a data driver, a timing controller, etc., and the data driver, the timing controller, etc. may be disposed in the peripheral region 20.

A sub-pixel circuit (e.g., a SUB-PIXEL CIRCUIT of FIG. 3C) may be disposed in each of the sub-pixel regions 30 of the display region 10, and OLEDs (e.g., an OLED of FIG. 3C) may be disposed on the sub-pixel circuit. An image (or a displaying image) may be displayed in the display region 10 through the sub-pixel circuit and the OLED.

First, second, and third sub-pixel circuits may be disposed in the sub-pixel regions 30. In one exemplary embodiment, for example, the first sub-pixel circuit may be coupled to (or connected to) a first OLED capable of emitting a red color of light, and the second sub-pixel circuit may be coupled to a second OLED capable of emitting a green color of light. The third sub-pixel circuit may be coupled to the third sub-pixel structure capable of emitting a blue color of light.

In an exemplary embodiment, the first OLED may be disposed to overlap the first sub-pixel circuit, and the second OLED may be disposed to overlap the second sub-pixel circuit. The third OLED may be disposed to overlap the third sub-pixel circuit. Alternatively, the first OLED may be disposed to overlap a portion of the first sub-pixel circuit and a portion of a sub-pixel circuit that is different from the first sub-pixel circuit, and the second OLED may be disposed to overlap a portion of the second sub-pixel circuit and a portion of a sub-pixel circuit region that is different from the second sub-pixel circuit. The third OLED may be disposed to overlap a portion of the third sub-pixel circuit and a portion of a sub-pixel circuit that is different from the third sub-pixel circuit.

In one exemplary embodiment, for example, the first, second, and third OLEDs may be arranged based on a RGB stripe method where tetragons of a same size are sequentially arranged, a s-stripe method including a blue OLED having a relatively large area, a WRGB method further including a white OLED, a pen-tile method repeatedly arranged in an RG-GB pattern, etc.

In an exemplary embodiment, at least one driving transistor, at least one switching transistor, and at least one capacitor may be disposed in each of the sub-pixel regions 30. In one exemplary embodiment, for example, a single driving transistor (e.g., a first transistor TR1 of FIG. 3C), six switching transistors (e.g., second through seventh transistors TR2, TR3, TR4, TR5, TR6, and TR7 of FIG. 3C), and a single storage capacitor (e.g., a storage capacitor CST of FIG. 3C) may be disposed in each of the sub-pixel regions 30.

In an exemplary embodiment, a shape of each of the display region 10, the peripheral region 20, and the sub-pixel regions 30 when viewed from a plane view in a thickness direction of the OLED display device 100 has a plan shape of a tetragon, but not being limited thereto. In one exemplary embodiment, for example, the shape of each of the display region 10, the peripheral region 20, and the sub-pixel regions 30 may have a plan shape of a triangle, a plan shape of a diamond, a plan shape of a polygon, a plan shape of a circle, a plan shape of an athletic track, a plan shape of an elliptic, etc.

An external device 101 may be electrically connected to the OLED display device 100 through a flexible printed circuit board ("FPCB"). In one exemplary embodiment, for example, a side of the FPCB may be in direct contact with the pad electrodes 470, and another side of the FPCB may be in direct contact with the external device 101. The external device 101 may provide a data signal, a gate signal, a light emission signal, a gate initialization signal, an initialization voltage, a power supply, etc. to the OLED display device 100. In an exemplary embodiment, a driving integrated circuit may be mounted (or installed) in the FPCB. In an exemplary embodiment, the driving integrated circuit may be mounted in the OLED display device 100 located adjacent to the pad electrodes 470. Alternatively, the OLED display device 100 includes a bending region, and the pad electrodes 470 and the external device 101 may be electrically connected through the FPCB.

The first circuit structure 800 may include a gate driver, and the gate driver may include a plurality of gate stages (e.g., a gate state GST of FIG. 3A), each including at least one transistor (e.g., a first transistor 850 of FIG. 4) and at least one capacitor. The first circuit structure 800 may receive the gate signal from the external device 101, and the gate signal may be provided to the sub-pixel circuit through the gate stages of the gate driver.

The second circuit structure 600 may include a light emission driver, and the light emission driver may include a plurality of light emission stage (e.g., a light emission stage EST), each including at least one transistor (e.g., a second transistor 650 of FIG. 4) and at least one capacitor. The first stepped portion 660 may receive the light emission signal from the external device 101, and the light emission signal may be provided to the sub-pixel circuit through the light emission stages of the light emission driver.

Figure 3A:
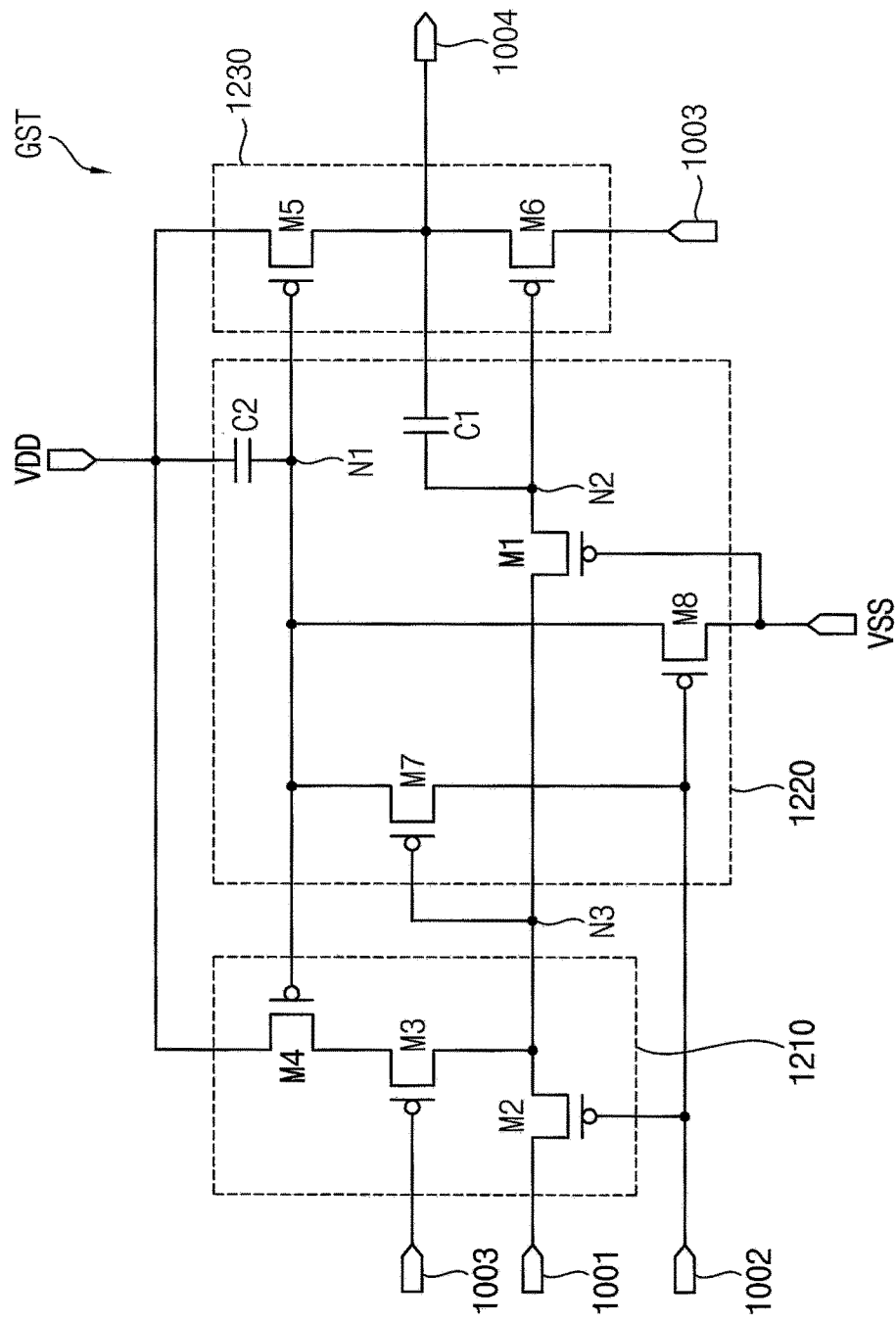
FIG. 3A is a circuit diagram illustrating a gate state included in a first circuit structure of FIG. 1A.

FIG. 3A is a circuit diagram illustrating a gate stage included in a first circuit structure of FIG. 1A.

Referring to FIG. 3A, an exemplary embodiment of a gate stage GST may include a first driver 1210, a second driver 1220, an output circuit 1230, and a first transistor M1.

The output circuit 1230 may include a fifth transistor M5 and a sixth transistor M6. The output circuit 1230 may control a voltage supplied to an output terminal 1004 based on a first node N1 and a second node N2. The fifth transistor M5 may be coupled between a first driving power supply VDD wire (e.g., a high power supply wire) and the output terminal 1004, and a gate electrode of the fifth transistor M5 may be coupled to the first node N1. The fifth transistor M5 may control a connection between the first driving power supply VDD wire and the output terminal 1004 based on a voltage applied to the first node N1. The sixth transistor M6 may be coupled between the output terminal 1004 and a third input terminal 1003, and a gate electrode of the sixth transistor M6 may be coupled to the second node N2. The sixth transistor M6 may control a connection of the output terminal 1004 and the third input terminal 1003 based on a voltage applied to the second node N2. The output circuit 1230 may operate as a buffer. Alternatively, the fifth transistor M5 and/or the sixth transistor M6 may have a configuration where a plurality of transistors are coupled in parallel to each other.

The first driver 1210 may include a second transistor M2, a third transistor M3, and a fourth transistor M4. The first driver 1210 may control a voltage of a third node N3 based on clock signals supplied to a first input terminal 1001, a second input terminal 1002 and a third input terminal 1003. The second transistor M2 may be coupled between the first input terminal 1001 and the third node N3, and a gate electrode of the second transistor M2 may be coupled to the second input terminal 1002. The second transistor M2 may control a connection of the first input terminal 1001 and the third node N3 based on a clock signal supplied to the second input terminal 1002. The third transistor M3 and the fourth transistor M4 may be coupled between the third node N3 and the first driving power supply VDD wire in series. The third transistor M3 may be coupled between the fourth transistor M4 and the third node N3, and a gate electrode of the third transistor M3 may be coupled to the third input terminal 1003. The third transistor M3 may control a connection of the fourth transistor M4 and the third node N3 based on a clock signal supplied to the third input terminal 1003. The fourth transistor M4 may be coupled between the third transistor M3 and the first driving power supply VDD wire, and a gate electrode of the fourth transistor M4 may be coupled to the first node N1. The fourth transistor M4 may control a connection of the third transistor M3 and the first driving power supply VDD wire based on a voltage of the first node N1.

The second driver 1220 may include a seventh transistor M7, an eighth transistor M8, a first capacitor C1, and a second capacitor C2. The second driver 1220 may control a voltage of the first node N1 based on a voltage of the second input terminal 1002 and the third node N3. The first capacitor C1 may be coupled between the second node N2 and the output terminal 1004. The first capacitor C1 may charge a voltage based on a turn-on and a turn-off of the sixth transistor M6. The second capacitor C2 may be coupled between the first node N1 and the first driving power supply VDD wire. The second capacitor C2 may charge a voltage applied to the first node N1. The seventh transistor M7 may be coupled between the first node N1 and the second input terminal 1002, and a gate electrode of the seventh transistor M7 may be coupled to the third node N3. The seventh transistor M7 may control a connection of the first node N1 and the second input terminal 1002 based on a voltage of the third node N3. The eighth transistor M8 may be coupled between the first node N1 and a second driving power supply VSS wire (e.g., a low power supply wire), and a gate electrode of the eighth transistor M8 may be coupled to the second input terminal 1002. The eighth transistor M8 may control a connection of the first node N1 and the second driving power supply VSS wire based on a clock signal of the second input terminal 1002.

The first transistor M1 may be coupled between the third node N3 and the second node N2, and a gate electrode of the first transistor M1 may be coupled to the second driving power supply VSS. While the first transistor M1 maintains a turn-on state, an electrical connection of the third node N3 and the second node N2 may be maintained. Alternatively, the first transistor M1 may restrict a degree of a decrease of a voltage of the third node N3 based on a voltage of the second node N2. In such an embodiment, even when a voltage of the second node N2 decreases to a voltage lower than the second driving power supply VSS, the voltage of the third node N3 might not fall below a threshold voltage of the first transistor M1 subtracted from the second driving power supply VSS.

Accordingly, the first, second, and third input terminals 1001, 1002, and 1003 may be electrically connected to the first signal wires 710, 711, and 712, and the first driving power supply VDD wire may be electrically connected to the second signal wires 510, 511, and, 512. In such an embodiment, as clock signals applied to the first signal wires 710, 711, and 712 are provided to the first, second, and third input terminals 1001, 1002, and 1003, a gate signal (e.g., a gate signal GW of FIG. 3C) may be outputted to the output terminal 1004.

Figure 3B:
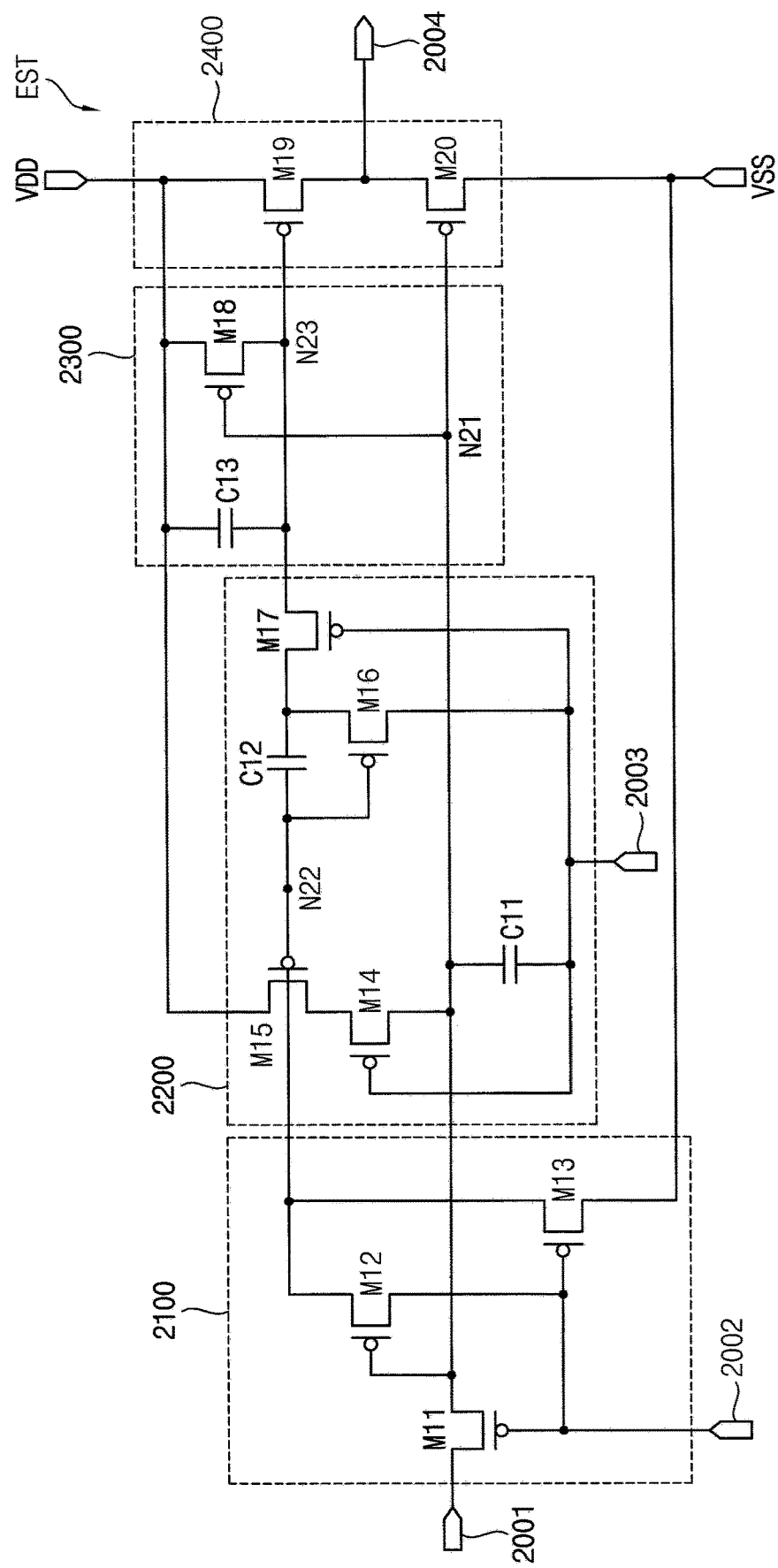
FIG. 3B is a circuit diagram illustrating a light emission state included in a second circuit structure of FIG. 1A.

FIG. 3B is a circuit diagram illustrating a light emission state included in a second circuit structure of FIG. 1A.

Referring to FIG. 3B, an exemplary embodiment of a light emission stage EST may include a first signal processor 2100, a second signal processor 2200, a third signal processor 2300, and an output circuit 2400.

The first signal processor 2100 may include a first transistor M11, a second transistor M12, and a third transistor M13. The first signal processor 2100 may control a voltage of a first node N21 and a second node N22 based on clock signals supplied to a first input terminal 2001 and a second input terminal 2002. The first transistor M11 may be coupled between the first input terminal 2001 and the first node N21, and a gate electrode of the first transistor M11 may be coupled to the second input terminal 2002. The first transistor M11 may be turned-on when a clock signal is supplied to the second input terminal 2002. The second transistor M12 may be coupled between the second input terminal 2002 and the second node N22, and a gate electrode of the second transistor M12 may be coupled to the first node N21. The second transistor M12 may be turned-on or turned-off based on a voltage of the first node N21. The third transistor M13 may be coupled between the second driving power supply VSS wire and the second node N22, and a gate electrode of the third transistor M13 may be coupled to the second input terminal 2002. The third transistor M13 may be turned-on when the clock signal is supplied to the second input terminal 2002.

The second signal processor 2200 may include a fourth transistor M14, a fifth transistor M15, a sixth transistor M16, a seventh transistor M17, a first capacitor C11, and a second capacitor C12. The second signal processor 2200 may control a voltage of the first node N21 and a third node N23 based on a clock signal supplied to a third input terminal 2003 and a voltage of the second node N22. The fourth transistor M14 may be coupled between the fifth transistor M15 and the first node N21, and a gate electrode of the fourth transistor M14 may be coupled to the third input terminal 2003. The fourth transistor M14 may be turned-on when a clock signal is supplied to the third input terminal 2003. The fifth transistor M15 may be coupled between the first driving power supply VDD wire and the fourth transistor M14, and a gate electrode of the fifth transistor M15 may be coupled to the second node N22. The fifth transistor M15 may be turned-on or turned-off based on a voltage of the second node N22. The sixth transistor M16 may be coupled between a first electrode of the seventh transistor M17 and the third input terminal 2003, and a gate electrode of the sixth transistor M16 may be coupled to the second node N22. The sixth transistor M16 may be turned-on or turned-off based on a voltage of the second node N22. The seventh transistor M17 may be coupled between a first electrode of the sixth transistor M16 and the third node N23, and a gate electrode of the seventh transistor M17 may be coupled to the third input terminal 2003. The seventh transistor M17 may be turned-on when a clock signal is supplied to the third input terminal 2003. The first capacitor C11 may be coupled between the first node N21 and the third input terminal 2003. The second capacitor C12 may be coupled to between the second node N22 and a first electrode of the seventh transistor M17.

The third signal processor 2300 may include an eighth transistor M18 and a third capacitor C13. The third signal processor 2300 may control a voltage of a third node N23 based on a voltage of the first node N21. The eighth transistor M18 may be coupled between the first driving power supply VDD wire and the third node N23, and a gate electrode of the eighth transistor M18 may be coupled to the first node N21. The eighth transistor M18 may be turned-on or turned-off based on a voltage of the first node N21. The third capacitor C13 may be coupled between the first driving power supply VDD wire and the third node N23.

The output circuit 2400 may include a ninth transistor M19 and a tenth transistor M20. The output circuit 2400 may control a voltage supplied to an output terminal 2004 based on a voltage of the first node N21 and third node N23. The ninth transistor M19 may be coupled between the first driving power supply VDD wire and the output terminal 2004, and a gate electrode of the ninth transistor M19 may be coupled to the third node N23. The ninth transistor M19 may be turned-on or turned-off based on a voltage of the third node N23. The tenth transistor M20 may be coupled between the output terminal 2004 and the second driving power supply VSS wire, and a gate electrode of the tenth transistor M20 may be coupled to the first node N21. The tenth transistor M20 may be turned-on or turned-off based on a voltage of the first node N21. The tenth transistor M20 may be coupled between the output terminal 2004 and the second driving power supply VSS wire, and a gate electrode of the tenth transistor M20 may be coupled to the first node N21. The tenth transistor M20 may be turned-on or turned-off based on a voltage of the first node N21. The output circuit 2400 may operate as a buffer. Alternatively, the ninth transistor M19 and/or the tenth transistor M20 may have a configuration where a plurality of transistors are coupled in parallel to each other.

Accordingly, the first, second, and third input terminals 2001, 2002, and 2003 may be electrically connected to the first signal wires 710, 711, and 712, and the first driving power supply VDD wire may be electrically connected to the second signal wires 510, 511, and 512. In such an embodiment, as clock signals applied to the first signal wires 710, 711, and 712 are provided to the first, second, and third input terminals 2001, 2002, and 2003, a light emission signal (e.g., a light emission signal EM of FIG. 3C) may be outputted to the output terminal 2004.

Figure 3C:
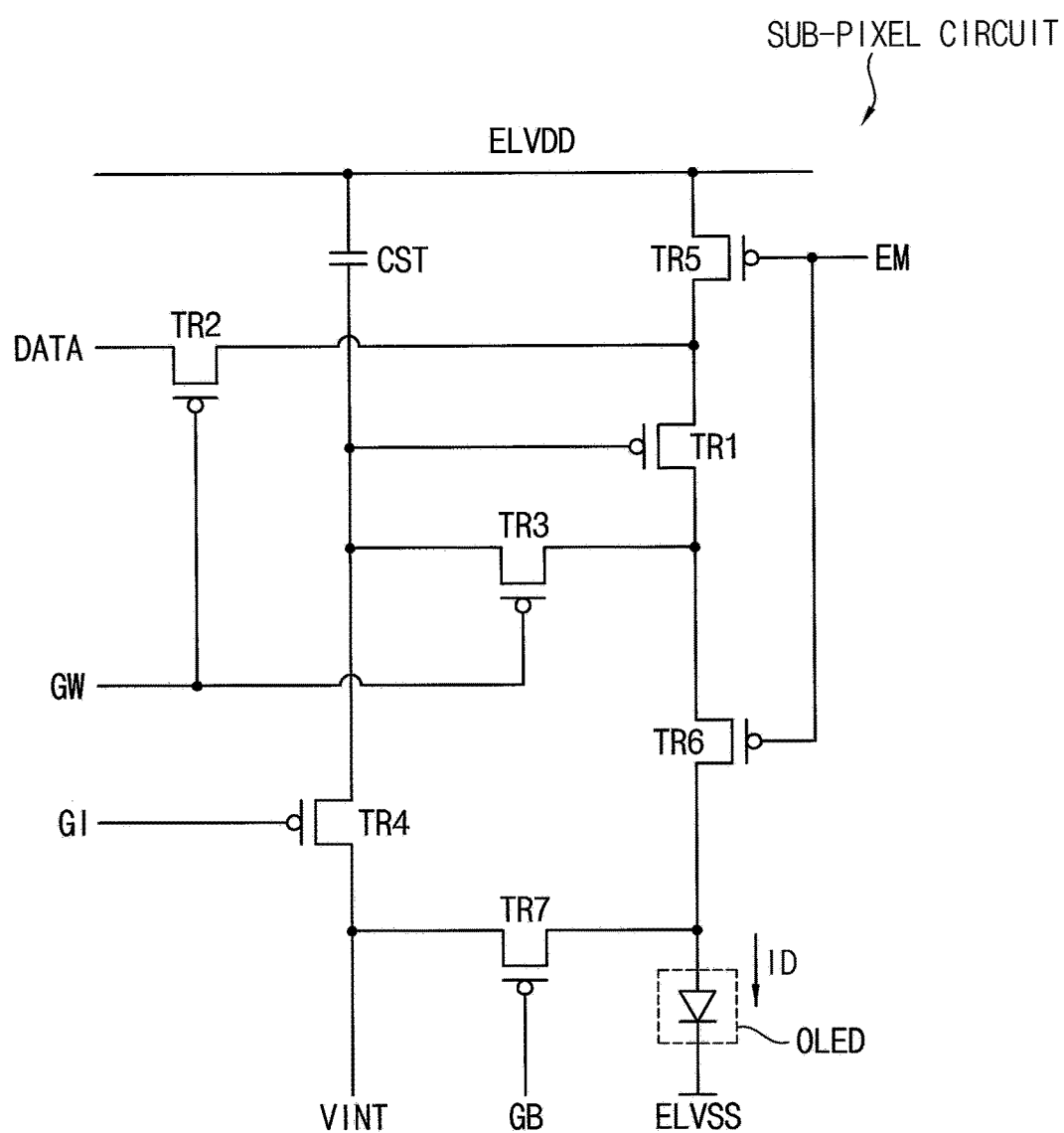
FIG. 3C is a circuit diagram illustrating a sub-pixel circuit and an OLED disposed in a sub-pixel region of FIG. 1A.

FIG. 3C is a circuit diagram illustrating a sub-pixel circuit and an OLED disposed in a sub-pixel region of FIG. 1A.

Referring to FIG. 3C, a sub-pixel circuit ("SPC") and an OLED (e.g., corresponding to a sub-pixel structure 200 of FIG. 4) may be disposed in each of the sub-pixel regions 30 of the OLED display device 100, and the OLED may be disposed on the SPC. The SPC may include first, second, third, fourth, fifth, sixth, and seventh transistors TR1, TR2, TR3, TR4, TR5, TR6, and TR7, a storage capacitor CST, a high power supply ELVDD wire, a low power supply ELVSS wire, an initialization voltage VINT wire, a data signal DATA wire, a gate signal GW wire, a gate initialization signal GI wire, a light emission signal EM wire, a diode initialization signal GB wire, etc.

The OLED may emit light based on a driving current ID. The OLED may include a first terminal and a second terminal. In an exemplary embodiment, the second terminal of the OLED receives a low power supply voltage ELVSS. In one exemplary embodiment, for example, the first terminal of the OLED is an anode terminal, and the second terminal of the OLED is a cathode terminal. Alternatively, the first terminal of the OLED may be a cathode terminal, and the second terminal of the OLED may be an anode terminal. In an exemplary embodiment, the anode terminal of the OLED may correspond to a lower electrode 290 of FIG. 4, and the cathode terminal of the OLED may correspond to an upper electrode 340 of FIG. 4.

The first transistor TR1 (e.g., a driving transistor 253 of FIG. 4) may include a gate terminal, a first terminal, and a second terminal. In an exemplary embodiment, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In an exemplary embodiment, the first transistor TR1 operates in a saturation region. In such an embodiment, the first transistor TR1 may generate the driving current ID based on a voltage difference of the gate terminal and the source terminal, and a gradation (e.g., luminance of light corresponding to a grayscale level of an image to be displayed by the sub-pixel) may be implemented based on the amount of the driving current ID generated by the first transistor TR1. Alternatively, the first transistor TR1 operates in a linear region. In such an embodiment, a gradation may be implemented based on the amount of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. The second terminal of the second transistor TR2 may be connected to the first terminal of the first transistor TR1. In one exemplary embodiment, for example, the gate signal GW may be generated from a gate stage GST included in a first circuit structure 800 of FIG. 1, and may be applied to the gate terminal of the second transistor TR2 through the gate signal GW wire. In an exemplary embodiment, the first terminal of the second transistor TR2 is a source terminal, and the second terminal of the second transistor TR2 is a drain terminal. Alternatively, the first terminal of the second transistor TR2 may be a drain terminal, and the second terminal of the second transistor TR2 may be a source terminal.

In an exemplary embodiment, the second transistor TR2 may provide the data signal DATA to the first terminal of the first transistor TR1 while the gate signal GW is activated (or turned on). In such an embodiment, the second transistor TR2 operates in a linear region.

The third transistor TR3 may include a gate terminal, a first terminal, and a second terminal. The gate terminal of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. In one exemplary embodiment, for example, the gate signal GW may be generated from the first circuit structure 800 of FIG. 1, and the gate signal GW may be applied to the gate terminal of the third transistor TR3 through the gate signal GW wire. In an exemplary embodiment, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

In an exemplary embodiment, the third transistor TR3 may connect the gate terminal of the first transistor TR1 to the second terminal of the first transistor TR1 while the gate signal GW is activated. In such an embodiment, the third transistor TR3 may operate in a linear region. In such an embodiment, the third transistor TR3 may form a diode connection of the first transistor TR1 while the gate signal GW is activated. A voltage difference, which corresponds to a threshold voltage of the first transistor TR1, between the first terminal of the first transistor TR1 and the gate terminal of the first transistor TR1 may occur due to the diode connection of the first transistor TR1. As a result, a sum voltage of the data signal DATA provided to the first terminal of the first transistor TR1 and the voltage difference (i.e., the threshold voltage) may be applied to the gate terminal of the first transistor TR1 while the gate signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved by effectively preventing or substantially reducing an affect by the threshold voltage of the first transistor TR1.

An input terminal of the initialization voltage VINT wire applied to an initialization voltage VINT is connected to a first terminal of the fourth transistor TR4 and a first terminal of the seventh transistor TR7, and an output terminal of the initialization voltage VINT wire is connected to a second terminal of the fourth transistor TR4 and a first terminal of the storage capacitor CST.

The fourth transistor TR4 may include a gate terminal, the first terminal, and the second terminal. The gate terminal of the fourth transistor TR4 may receive a gate initialization signal GI. The initialization voltage VINT may be applied to the first terminal of the fourth transistor TR4. The second terminal of the fourth transistor TR4 may be connected to the gate terminal of the first transistor TR1. In an exemplary embodiment, the first terminal of the fourth transistor TR4 is a source terminal, and the second terminal of the fourth transistor TR4 is a drain terminal. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the gate initialization signal GI is activated. In such an embodiment, the fourth transistor TR4 may operate in the linear region. Thus, the fourth transistor TR4 may initialize the gate terminal of the first transistor TR1 as the initialization voltage VINT while the gate initialization signal GI is activated. In an exemplary embodiment, a voltage level of the initialization voltage VINT is sufficiently lower than a voltage level of the data signal DATA maintained by the storage capacitor CST in a previous frame. In such an embodiment, the initialization voltage VINT may be applied to the gate terminal of the first transistor TR1 that is a P-channel metal oxide semiconductor ("PMOS") type transistor. In an alternative exemplary embodiment, a voltage level of the initialization voltage VINT is sufficiently higher than the voltage level of the data signal DATA maintained by the storage capacitor CST in a previous frame. In such an embodiment, the initialization voltage VINT may be applied to the gate terminal of the first transistor TR1 that is an N-channel metal oxide semiconductor ("NMOS") type transistor.

In an exemplary embodiment, the gate initialization signal GI is identical to the gate signal GW advanced or phase-shifted by one horizontal time period. In one exemplary embodiment, for example, the gate initialization signal GI that is applied to SPC located in a n-th row among a plurality of SPCs included in the OLED display device 100 (where n is an integer of 2 or more) may be substantially a same as the gate signal GW that is applied to SPC located in a (n−1)-th row among a plurality of the SPCs. In such an embodiment, the gate initialization signal GI that is activated may be applied to the SPC located in the n-th row among the SPCs by applying the gate signal GW that is activated to the SPC located in the (n−1)-th row among the SPCs. As a result, the gate terminal of the first transistor TR1 included in the SPC located in the n-th row among the SPCs may be initialized as the initialization voltage VINT when the data signal DATA is applied to SPC located in the (n−1)-th row among the SPCs.

The fifth transistor TR5 (e.g., corresponding to a switching transistor 250 of FIG. 4) may include a gate terminal, a first terminal, and a second terminal. A light emission signal EM may be applied to the gate terminal of the fifth transistor TR5. A high power supply ELVDD may be applied to the first terminal of the fifth transistor TR5. The second terminal of the fifth transistor TR5 may be connected to the first terminal of the first transistor TR1. In one exemplary embodiment, for example, the light emission signal EM may be generated from a light emission stage EST included in a second circuit structure 600 of FIG. 1, and may be applied to the gate terminal of the fifth transistor TR5 through the light emission signal EM wire. In an exemplary embodiment, the first terminal of the fifth transistor TR5 is a source terminal, and the second terminal of the fifth transistor TR5 is a drain terminal. In an alternative exemplary embodiment, the first terminal of the fifth transistor TR5 may be a drain terminal, and the second terminal of the fifth transistor TR5 may be a source terminal.

The fifth transistor TR5 may apply the high power supply ELVDD to the first terminal of the first transistor TR1 while the light emission signal EM is activated, and the fifth transistor TR5 may not apply the high power supply ELVDD while the light emission signal EM is inactivated. In such an embodiment, the fifth transistor TR5 may operate in the linear region. The fifth transistor TR5 may apply the high power supply ELVDD to the first terminal of the first transistor TR1 while the light emission signal EM is activated, such that the first transistor TR1 generates the driving current ID. In such an embodiment, the fifth transistor TR5 may not apply the high power supply ELVDD while the light emission signal EM is inactivated, such that the data signal DATA applied to the first terminal of the first transistor TR1 is applied to the gate terminal of the first transistor TR1.

The sixth transistor TR6 may include a gate terminal, a first terminal, and a second terminal. The light emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In one exemplary embodiment, for example, the light emission signal EM may be generated from the second circuit structure 600 of FIG. 1, and may be applied to the gate terminal of the sixth transistor TR6 through the light emission signal EM wire. In an exemplary embodiment, the first terminal of the sixth transistor TR6 is a source terminal, and the second terminal of the sixth transistor TR6 is a drain terminal. In an alternative exemplary embodiment, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the light emission signal EM is activated. In such an embodiment, the sixth transistor TR6 may operate in the linear region. In such an embodiment, the sixth transistor TR6 may provide the driving current ID generated by the first transistor TR1 to the OLED while the light emission signal EM is activated, such that the OLED emits light. In such an embodiment, the sixth transistor TR6 may electrically disconnect the first transistor TR1 from the OLED while the light emission signal EM is inactivated, such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB may be applied to the gate terminal of the seventh transistor TR7. The initialization voltage VINT may be applied to the first terminal of the seventh transistor TR7. The second terminal of the seventh transistor TR7 may be connected to the first terminal of the OLED. In an exemplary embodiment, the first terminal of the seventh transistor TR7 is a source terminal, and the second terminal of the seventh transistor TR7 is a drain terminal. In an alternative exemplary embodiment, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. In such an embodiment, the seventh transistor TR7 may operate in the linear region. In such an embodiment, the seventh transistor TR7 may initialize the first terminal of the OLED as the initialization voltage VINT while the diode initialization signal GB is activated.

Alternatively, the gate initialization signal GI and the diode initialization signal GB are a substantially same signal as each other. An initialization operation of the gate terminal of the first transistor TR1 may not affect an initialization operation of the first terminal of the OLED. In such an embodiment, the initialization operation of the gate terminal of the first transistor TR1 and the initialization operation of the first terminal of the OLED may be independent of each other. Therefore, the gate initialization signal GI is used as the diode initialization signal GB, thereby improving the manufacturing efficiency.

The storage capacitor CST may include the first terminal and the second terminal, and may be connected between the high power supply ELVDD wire and the gate terminal of the first transistor TR1. In one exemplary embodiment, for example, the first terminal of the storage capacitor CST may be connected to the gate terminal of the first transistor TR1, and the second terminal of the storage capacitor CST may be connected to the high power supply ELVDD wire. The storage capacitor CST may maintain a voltage level of the gate terminal of the first transistor TR1 while the gate signal GW is inactivated. The light emission signal EM may be activated while the gate signal GW is inactivated (e.g., a section where the gate signal GW is inactivated may include a section where the light emission signal EM is activated). The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

In an exemplary embodiment, the SPC includes seven transistors and a single capacitor, but not being limited thereto. In one exemplary embodiment, for example, the SPC may have a configuration including at least one transistor and at least one capacitor.

Figure 4:
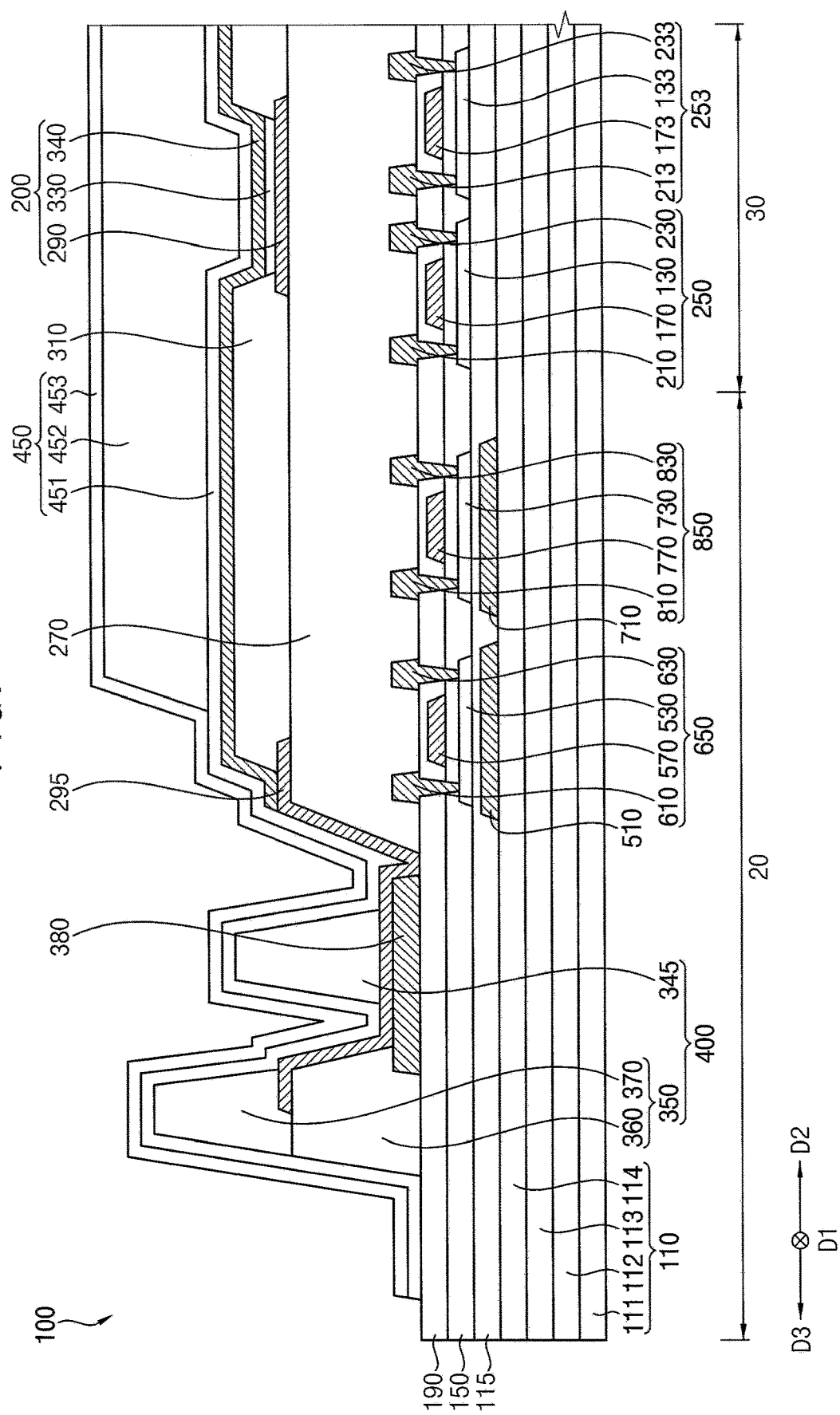
FIG. 4 is a cross-sectional view taken along line I-I' of FIG. 1.
Figure 5A:
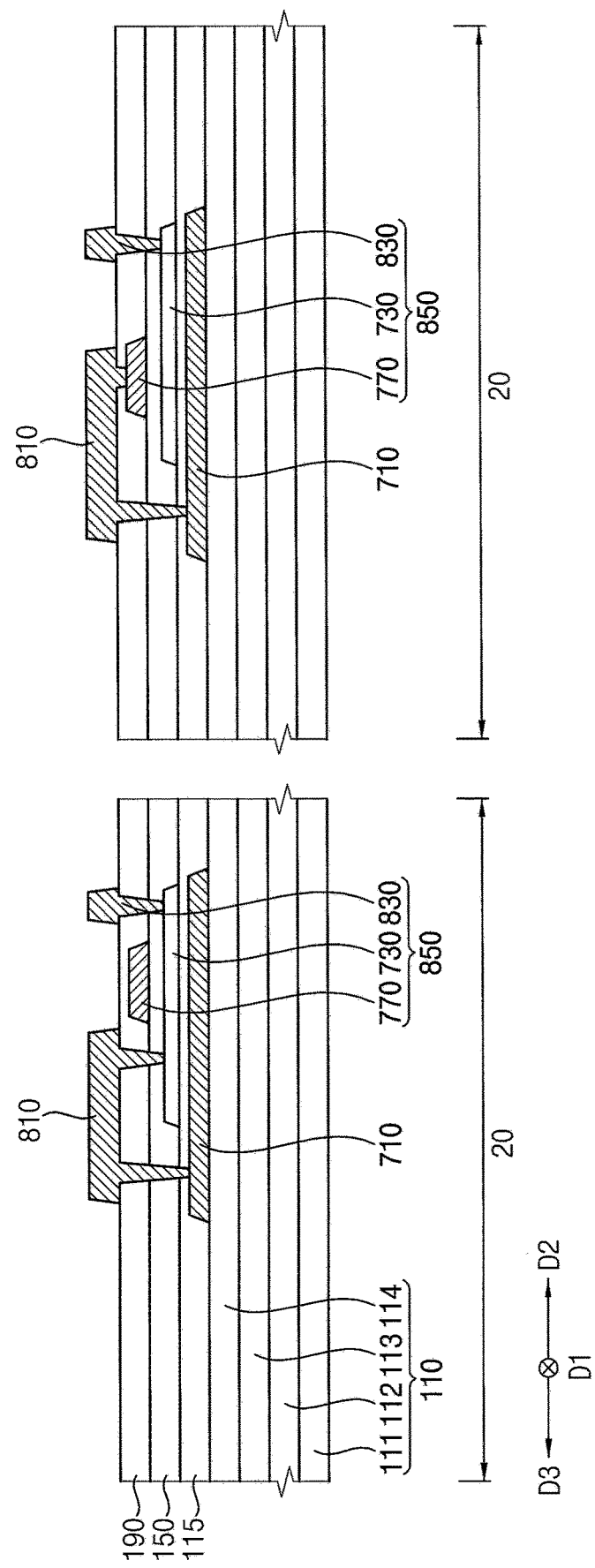
FIG. 5A is a cross-sectional view illustrating a connection of a first transistor and a first signal wire that are included in the OLED display device of FIG. 4.
Figure 5B:
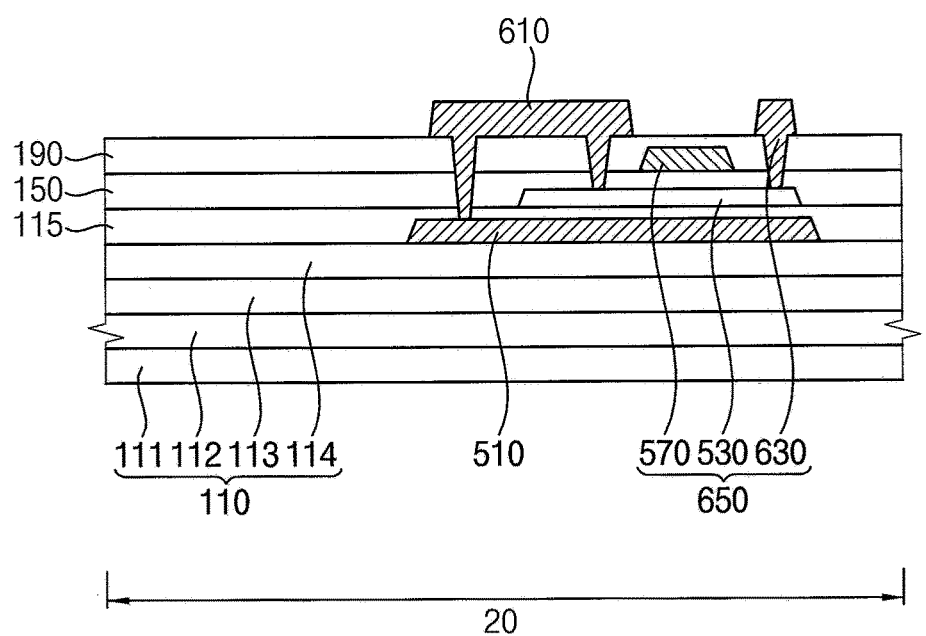
FIG. 5B is a cross-sectional view illustrating a connection of a first transistor and a first signal wire that are included in the OLED display device of FIG. 4.

FIG. 4 is a cross-sectional view taken along line I-I' of FIG. 1, and FIG. 5A is a cross-sectional view illustrating a connection of a first transistor and a first signal wire that are included in the OLED display device of FIG. 4. FIG. 5B is a cross-sectional view illustrating a connection of a first transistor and a first signal wire that are included in the OLED display device of FIG. 4.

Referring to FIGS. 1 and 4, an exemplary embodiment of an OLED display device 100 may include a substrate 110, a buffer layer 115, a first signal wire 710, a second signal wire 510, a first circuit structure 800, a second circuit structure 600, a gate insulation layer 150, an insulating interlayer 190, a power supply wire 380, a switching transistor 250, a driving transistor 253, a planarization layer 270, a block structure 400, a sub-pixel structure 200, a connection pattern 295, a pixel defining layer 310, a thin film encapsulation ("TFE") structure 450, etc. Here, the substrate 110 may include a first organic layer 111, a first barrier layer 112, a second organic layer 113, and a second barrier layer 114. In an exemplary embodiment, the OLED display device 100 includes a sub-pixel region 30 and a peripheral region 20, and the substrate 110 may be divided as the sub-pixel region 30 and the peripheral region 20. The first circuit structure 800 (e.g., a gate driver) may include a first transistor 850, and the first transistor 850 may include a first active pattern 730, a first gate electrode pattern 770, a first source electrode pattern 810, and a first drain electrode pattern 830. The second circuit structure 600 (e.g., a light emission driver) may include a second transistor 650, and the second transistor 650 may include a second active pattern 530, a second gate electrode pattern 570, a second source electrode pattern 610, and a second drain electrode pattern 630. In such an embodiment, the switching transistor 250 may include a first active layer 130, a first gate electrode 170, a first source electrode 210, and a first drain electrode 230, and the driving transistor 253 may include a second active layer 133, a second gate electrode 173, a second source electrode 213, and a second drain electrode 233. The block structure 400 may include a first block pattern 345 and a second block pattern 350, and the second block pattern 350 may include a first sub-block pattern 360 and a second sub-block pattern 370. In such an embodiment, the sub-pixel structure 200 may include a lower electrode 290, a light emitting layer 330, and an upper electrode 340, and the TFE structure 450 may include a first TFE layer 451, a second TFE layer 452, and a third TFE layer 453.

In an exemplary embodiment, as described above, the OLED display device 100 may include the display region 10 including a plurality of sub-pixel regions 30 and the peripheral region 20 surrounding the display region 10. In one exemplary embodiment, for example, the sub-pixel region 30 of FIG. 4 may correspond to the sub-pixel region 30, which is located adjacent to the peripheral region 20, among a plurality of sub-pixel regions 30. In FIG. 4, the sub-pixel region 30 may be located at an outmost portion of the display region 10.

An image may be displayed in the sub-pixel region 30 through the sub-pixel structure 200, and the block structure 400, the power supply wire 380 (e.g., a low power supply wire), the first transistor 850, the second transistor 650, the first signal wire 710, the second signal wire 510, etc. may be disposed in the peripheral region 20. Here, the peripheral region 20 may be a non-display region. A plurality of transistors, a plurality of capacitors, a plurality of wires (e.g., a gate signal wire, a data signal wire, a high power supply wire, a light emission signal wire, an initialization signal wire, etc.), for example, may be additionally disposed in the display region 10. In an exemplary embodiment, the OLED display device 100 includes the flexible substrate 110 and the TFE structure 450, the OLED display device 100 may serve as a flexible OLED display device.

The first organic layer 111 may define the lowermost part of the OLED display device 100. The first organic layer 111 may include an organic material having flexibility. In an exemplary embodiment, the first organic layer 111 may include polyimide, for example.

The first barrier layer 112 may be disposed on the entire first organic layer 111. The first barrier layer 112 may block moisture or water that may be permeated through the first organic layer 111. The first barrier layer 112 may include an inorganic material having flexibility. In an exemplary embodiment, the first barrier layer 112 may include silicon oxide or silicon nitride, for example.

The second organic layer 113 may be disposed on the first barrier layer 112. The second organic layer 113 may be disposed on the entire first barrier layer 112. The second organic layer 113 may include an organic material having flexibility. In an exemplary embodiment, the second organic layer 113 may include polyimide, for example.

The second barrier layer 114 may be disposed on the entire second organic layer 113. The second barrier layer 114 may block moisture or water that may be permeated through the second organic layer 113. The second barrier layer 114 may include an inorganic material having flexibility. In an exemplary embodiment, the second barrier layer 114 may include silicon oxide or silicon nitride, for example.

Accordingly, the substrate 110 including the first organic film layer 111, the first barrier layer 112, the second organic layer 113, and the second barrier layer 114 may be disposed.

In an exemplary embodiment, the substrate 110 includes four layers, but not being limited thereto. In one exemplary embodiment, for example, in some an exemplary embodiment, the substrate 110 may include a single layer or at least two layers, e.g., three or five layers.

In an exemplary embodiment, the first signal wire 710 may be disposed in the peripheral region 20 on the substrate 110 (e.g., the second barrier layer 114). In such an embodiment, the first signal wire 710 may be disposed in the peripheral region 20 between the substrate 110 and the buffer layer 115, and may partially overlap the first transistor 850. The first signal wire 710 may be disposed adjacent to a boundary of the peripheral region 20 and the sub-pixel region 30. Here, the first signal wire 710 may be one of first signal wires 710, 711, and 712 of FIG. 1B. In an exemplary embodiment, the first signal wire 710 may be a clock signal wire, and may receive a clock signal generated from an external device 101. The first signal wire 710 may extend in a first direction D1 that is in parallel to an upper surface of the substrate 110. In such an embodiment, as illustrated in FIG. 5A, the first signal wire 710 may be electrically connected to the first transistor 850 when viewed from a different cross-sectional view of the OLED display device 100. In one exemplary embodiment, for example, the first signal wire 710 may provide the clock signal to the first source electrode pattern 810 of the first transistor 850, or may provide the clock signal to the first gate electrode pattern 770 of the first transistor 850. Here, the first transistor 850 may be one among first through eighth transistors M1, M2, M3, M4, M5, M6, M7, and M8 of FIG. 3A.

In such an embodiment, the first signal wire 710 may be electrically connected to the second transistor 650 in another different cross-sectional view of the OLED display device 100. In one exemplary embodiment, for example, the first signal wire 710 may provide the clock signal to the second transistor 650.

The first signal wire 710 may include at least one selected from a metal, an alloy of a metal, metal nitride, conductive metal oxide and a transparent conductive material, for example. In one exemplary embodiment, for example, the first signal wire 710 may include at least one selected from gold (Au), silver (Ag), aluminium (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminium nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SrRuO), zinc oxide (ZnO), indium tin oxide ("ITO"), stannum oxide (SnO), indium oxide (InO), gallium oxide (GaO) and indium zinc oxide ("IZO"), for example. These materials may be used alone or in a suitable combination thereof. Alternatively, the first signal wire 710 may have a multi-layered structure including a plurality of layers. In an alternative exemplary embodiment, the first signal wire 710 may essentially consist of super aluminium metal, for example.

The second signal wire 510 may be disposed in the peripheral region 20 on the substrate 110, and may be spaced apart from the first signal wire 710. In such an embodiment, the second signal wire 510 may be spaced apart from the first signal wire 710 by a third direction D3 in the peripheral region 20 between the substrate 110 and the buffer layer 115, and may partially overlap the second transistor 650. In one exemplary embodiment, for example, third direction D3 may be perpendicular to the first direction D1, and third direction D3 may be opposite to a second direction D2. Here, the second signal wire 510 may be one among the second signal wires 510, 511, and 512 of FIG. 1B. In an exemplary embodiment, the second signal wire 510 may be a first driving power supply VDD, and may receive a first driving power supply VDD generated from the external device 101. The second signal wire 510 may extend in the first direction D1.

As illustrated in FIG. 5B, the second signal wire 510 may be electrically connected to the second transistor 650 in a different cross-sectional view of the OLED display device 100. In one exemplary embodiment, for example, the second signal wire 510 may provide the first driving power supply VDD to the second source electrode pattern 610 of the second transistor 650. Here, the second transistor 650 may be one among first through tenth transistors M11, M12, M13, M14, M15, M16, M17, M18, M19, and M20 of FIG. 3B.

The second signal wire 510 may be electrically connected to the first transistor 850 in another different cross-sectional view of the OLED display device 100. In one exemplary embodiment, for example, the second signal wire 510 may provide the first driving power supply VDD to the first transistor 850.

The second signal wire 510 may include at least one selected from a metal, an alloy of a metal, metal nitride, conductive metal oxide and a transparent conductive material, for example. These materials may be used alone or in a suitable combination thereof. Alternatively, the second signal wire 510 may have a multi-layered structure including a plurality of layers. In an alternative exemplary embodiment, the second signal wire 510 may essentially consist of super aluminium metal.

In an exemplary embodiment, each of the first signal wire 710 and the second signal wire 510 includes or defined by a single wire, but not being limited thereto. In one exemplary embodiment, for example, each of the first signal wire 710 and the second signal wire 510 may include at least two wires.

In a conventional OLED display device, the first signal wire 710 (i.e., a clock signal wire) and the first transistor 850 (i.e., a gate driver) may be disposed or located in a same layer as each other, and may be spaced apart from each other. In such a conventional OLED display device, the second signal wire 510 (i.e., a first driving power supply wire) and the second transistor 650 (i.e., a light emission driver) may be located in a same layer as each other, and may be spaced apart from each other. In such a conventional OLED display device, the light emission driver, the first driving power supply wire, the gate driver, and the clock signal wire may be spaced apart from each other in the peripheral region 20 on the substrate 110, such that an area of the peripheral region 20 may be relatively large. Accordingly, the conventional OLED display device may include a dead space having a relatively large area.

In an exemplary embodiment of the invention, the OLED display device 100 includes the first signal wire 710 disposed under the first circuit structure 800 and the second signal wire 510 disposed under the second circuit structure 600, an area of the peripheral region 20 of the substrate 110 may be relatively reduced. In such an embodiment, the OLED display device 100 may include a dead space having a relatively small area.

The buffer layer 115 may be disposed on the substrate 110, the first signal wire 710, and the second signal wire 510. The buffer layer 115 may cover the first signal wire 710 and the second signal wire 510 in the peripheral region 20 on the substrate 110, and may extend in the first direction D1. In such an embodiment, the buffer layer 115 may be disposed on the entire substrate 110 or to cover an entire upper surface of the substrate 110. In one exemplary embodiment, for example, the buffer layer 115 may sufficiently cover the first and second signal wires 710 and 510, and may have a substantially flat upper surface without a step around the first and second signal wires 710 and 510. Alternatively, the buffer layer 115 may cover the first and second signal wires 710 and 510 on the substrate 110, and may be disposed as a substantially uniform thickness along a profile of the first and second signal wires 710 and 510.

The buffer layer 115 may effectively prevent the diffusion of metal atoms and/or impurities from the substrate 110 into the first transistor 850, the second transistor 650, the switching transistor 250, and the driving transistor 253. In such an embodiment, the buffer layer 115 may control a rate of a heat transfer in a crystallization process for forming the first active pattern 730, the second active pattern 530, the first active layer 130, and the second active layer 133, thereby obtaining substantially uniform first and second active patterns 730 and 530 and first and second active layers 130 and 133. Furthermore, the buffer layer 115 may improve a surface flatness of the substrate 110 when a surface of the substrate 110 is relatively uneven. According to a type of the substrate 110, at least two buffer layers 115 may be provided on the substrate 110, or the buffer layer 115 may not be formed. In an exemplary embodiment, the buffer layer 115 may include an organic materials or an inorganic material. In one exemplary embodiment, for example, the buffer layer 115 may include an inorganic material.

The first active pattern 730 and the second active pattern 530 may be disposed in the peripheral region 20 on the buffer layer 115, and may be spaced apart from each other. The first active layer 130 and the second active layer 133 may be disposed in the sub-pixel region 30 on the buffer layer 115, and may be spaced apart from each other. In an exemplary embodiment, the first active pattern 730 may partially overlap the first signal wire 710, and the second active pattern 530 may partially overlap the second signal wire 510. Each of the first active pattern 730, the second active pattern 530, the first active layer 130, and the second active layer 133 may include at least one selected from a metal oxide semiconductor, an inorganic semiconductor (e.g., amorphous silicon or polysilicon), an organic semiconductor, etc.

The gate insulation layer 150 may be disposed on the buffer layer 115, the first and second active patterns 730 and 530, and the first and second active layers 130 and 133. The gate insulation layer 150 may cover the first and second active patterns 730 and 530 in the peripheral region 20 and the first and second active layers 130 and 133 in the sub-pixel region 30 on the buffer layer 115, and may extend in the first direction D1. In such an embodiment, the gate insulation layer 150 may be disposed on the entire buffer layer 115. In one exemplary embodiment, for example, the gate insulation layer 150 may sufficiently cover the first and second active patterns 730 and 530 and the first and second active layers 130 and 133 on the buffer layer 115, and may have a substantially flat upper surface without a step around the first and second active patterns 730 and 530 and the first and second active layers 130 and 133. Alternatively, the gate insulation layer 150 may cover the first and second active patterns 730 and 530 and the first and second active layers 130 and 133 on the buffer layer 115, and may be disposed as a substantially uniform thickness along a profile of the first and second active patterns 730 and 530 and the first and second active layers 130 and 133. The gate insulation layer 150 may include a silicon compound or a metal oxide, for example. In one exemplary embodiment, for example, the gate insulation layer 150 may include at least one selected from silicon oxide (SiO), silicon nitride (SiN), silicon oxynitride (SiON), silicon oxycarbide (SiOC), silicon carbon nitride (SiCN), aluminium oxide (AlO), aluminium nitride (AlN), tantalum oxide (TaO), hafnium oxide (HfO), zirconium oxide (ZrO) and titanium oxide (TiO), for example.

The first gate electrode pattern 770 and the second gate electrode pattern 570 may be disposed in the peripheral region 20 on the gate insulation layer 150, and may be spaced apart from each other. The first gate electrode 170 and the second gate electrode 173 may be disposed in the sub-pixel region 30 on the gate insulation layer 150, and may be spaced apart from each other. In one exemplary embodiment, for example, the first gate electrode pattern 770 may be disposed on the gate insulation layer 150 under which the first active pattern 730 is located, and the second gate electrode pattern 570 may be disposed on the gate insulation layer 150 under which the second active pattern 530 is located. The first gate electrode 170 may be disposed on the gate insulation layer 150 under which the first active layer 130 is located, and the second gate electrode 173 may be disposed on the gate insulation layer 150 under which the second active layer 133 is located. Each of the first and second gate electrode patterns 770 and 570 and the first and second gate electrodes 170 and 173 may include at least one selected from a metal, an alloy of a metal, a metal nitride, a conductive metal oxide and a transparent conductive material, for example. These materials may be used alone or in a suitable combination thereof. Alternatively, each of the first and second gate electrode patterns 770 and 570 and the first and second gate electrodes 170 and 173 may have a multi-layered structure including a plurality of layers.

The insulating interlayer 190 may be disposed on the gate insulation layer 150, the first and second gate electrode patterns 770 and 570, and the first and second gate electrodes 170 and 173. The insulating interlayer 190 may cover the first and second gate electrode patterns 770 and 570 in the peripheral region 20 and the first and second gate electrodes 170 and 173 in the sub-pixel region 30 on the gate insulation layer 150, and may extend in the first direction D1. In such an embodiment, the insulating interlayer 190 may be disposed on the entire gate insulation layer 150. In one exemplary embodiment, for example, the insulating interlayer 190 may sufficiently cover the first and second gate electrode patterns 770 and 570 and the first and second gate electrodes 170 and 173 on the gate insulation layer 150, and may have a substantially flat upper surface without a step around the first and second gate electrode patterns 770 and 570 and the first and second gate electrodes 170 and 173. Alternatively, the insulating interlayer 190 may cover the first and second gate electrode patterns 770 and 570 and the first and second gate electrodes 170 and 173 on the gate insulation layer 150, and may be disposed as a substantially uniform thickness along a profile of the first and second gate electrode patterns 770 and 570 and the first and second gate electrodes 170 and 173. The insulating interlayer 190 may include a silicon compound or a metal oxide, for example.

The first source electrode pattern 810, the first drain electrode pattern 830, the second source electrode pattern 610, and the second drain electrode pattern 630 may be disposed in the peripheral region 20 on the insulating interlayer 190, and may be spaced apart from each other. The first source electrode 210, the first drain electrode 230, the second source electrode 213, and the second drain electrode 233 may be disposed in the sub-pixel region 30 on the insulating interlayer 190, and may be spaced apart from each other.

The first source electrode pattern 810 may be in contact with a source region of the first active pattern 730 via a contact hole defined through the gate insulation layer 150 and the insulating interlayer 190, e.g., formed by removing a first portion of the gate insulation layer 150 and the insulating interlayer 190, and the first drain electrode pattern 830 may be in contact with a drain region of the first active pattern 730 via a contact hole defined through the gate insulation layer 150 and the insulating interlayer 190, e.g., formed by removing a second portion of the gate insulation layer 150 and the insulating interlayer 190.

The second source electrode pattern 610 may be in contact with a source region of the second active pattern 530 via a contact hole defined through the gate insulation layer 150 and the insulating interlayer 190, e.g., formed by removing a third portion of the gate insulation layer 150 and the insulating interlayer 190, and the second drain electrode pattern 630 may be in contact with a drain region of the second active pattern 530 via a contact hole defined through the gate insulation layer 150 and the insulating interlayer 190, e.g., formed by removing a fourth portion of the gate insulation layer 150 and the insulating interlayer 190.

The first source electrode 210 may be in contact with a source region of the first active layer 130 via a contact hole defined through the gate insulation layer 150 and the insulating interlayer 190, e.g., formed by removing a fifth portion of the gate insulation layer 150 and the insulating interlayer 190, and the first drain electrode 230 may be in contact with a drain region of the first active layer 130 via a contact hole defined through the gate insulation layer 150 and the insulating interlayer 190, e.g., formed by removing a sixth portion of the gate insulation layer 150 and the insulating interlayer 190.

The second source electrode 213 may be in contact with a source region of the second active layer 133 via a contact hole defined through the gate insulation layer 150 and the insulating interlayer 190, e.g., formed by removing a seventh portion of the gate insulation layer 150 and the insulating interlayer 190, and the second drain electrode 233 may be in contact with a drain region of the second active layer 133 via a contact hole defined through the gate insulation layer 150 and the insulating interlayer 190, e.g., formed by removing an eighth portion of the gate insulation layer 150 and the insulating interlayer 190.

Each of the first source and first drain electrode patterns 810 and 830, the second source and second drain electrode patterns 610 and 630, the first source and first drain electrodes 210 and 230, and the second source and second drain electrodes 213 and 233 may include at least one selected from a metal, an alloy of a metal, a metal nitride, a conductive metal oxide and a transparent conductive material, for example. These materials may be used alone or in a suitable combination thereof. Alternatively, each of the first source and first drain electrode patterns 810 and 830, the second source and second drain electrode patterns 610 and 630, the first source and first drain electrodes 210 and 230, and the second source and second drain electrodes 213 and 233 may have a multi-layered structure including a plurality of layers.

Accordingly, the first transistor 850 including the first active pattern 730, the first gate electrode pattern 770, the first source electrode pattern 810, and the first drain electrode pattern 830 may be disposed on the buffer layer 115, and the second transistor 650 including the second active pattern 530, the second gate electrode pattern 570, the second source electrode pattern 610, and the second drain electrode pattern 630 may be disposed on the buffer layer 115. In such an embodiment, the second transistor 650 may be spaced apart from the first transistor 850 by the third direction D3. In such an embodiment, the switching transistor 250 including the first active layer 130, the first gate electrode 170, the first source electrode 210, and the first drain electrode 230 may be disposed on the buffer layer 115, and the driving transistor 253 including the second active layer 133, the second gate electrode 173, the second source electrode 213, and the second drain electrode 233 may be disposed on the buffer layer 115. In such an embodiment, the driving transistor 253 may be spaced apart from the switching transistor 250 by the second direction D2.

In such an embodiment, as described above, the switching transistor 250 may correspond to a fifth transistor TR5 of FIG. 3C, and the driving transistor 253 may correspond to a first transistor TR1 of FIG. 3C. In such an embodiment, second through fourth transistors TR2, TR3, and TR4, sixth and seventh transistors TR6 and TR7, and a storage capacitor CST, etc. may be disposed in a different portion of the OLED display device 100.

In an exemplary embodiment, as shown in FIG. 4, each of the first transistor 850, the second transistor 650, the switching transistor 250 and the driving transistor 253 has a top gate structure, but not being limited thereto. In one alternative exemplary embodiment, for example, each of the first transistor 850, the second transistor 650, the switching transistor 250 and the driving transistor 253 may have a bottom gate structure and/or a double gate structure.

The power supply wire 380 may be disposed in the peripheral region 20 on the insulating interlayer 190. In an exemplary embodiment, the power supply wire 380 may be spaced apart from the first source and first drain electrode patterns 810 and 830, and from the second source and second drain electrode patterns 610 and 630. In an exemplary embodiment, as described above, a low power supply voltage ELVSS may be provided to the power supply wire 380 (refer to FIG. 3C). In such an embodiment, the low power supply voltage ELVSS may be applied to the upper electrode 340. In one exemplary embodiment, for example, the power supply wire 380 may include at least one selected from a metal, an alloy of a metal, metal nitride, a conductive metal oxide and a transparent conductive material, for example. These materials may be used alone or in a suitable combination thereof. Alternatively, the power supply wire 380 may have a multi-layered structure including a plurality of layers.

In an exemplary embodiment, the OLED display device 100 may further include a plurality of other wires in the peripheral region 20 or the sub-pixel region 30.

The planarization layer 270 may be disposed on the insulating interlayer 190, the power supply wire 380, the first source and first drain electrode patterns 810 and 830, the second source and second drain electrode patterns 610 and 630, the first source and first drain electrodes 210 and 230, and the second source and second drain electrodes 213 and 233, and may expose the power supply wire 380. The planarization layer 270 may be disposed with a great thickness to sufficiently cover the power supply wire 380, the first source and first drain electrode patterns 810 and 830, the second source and second drain electrode patterns 610 and 630, the first source and first drain electrodes 210 and 230, and the second source and second drain electrodes 213 and 233 on the insulating interlayer 190. In such an embodiment, the planarization layer 270 may have a substantially flat upper surface, and a planarization process may be further performed on the planarization layer 270 to implement the flat upper surface of the planarization layer 270. The planarization layer 270 may include an organic material or an inorganic material. In an exemplary embodiment, the planarization layer 270 may include an organic material. In one exemplary embodiment, for example, the planarization layer 270 may include at least one selected from a photoresist, a polyacryl-based resin, polyimide-based resin, a polyamide-based resin, a siloxane-based resin, acryl-based resin and an epoxy-based resin, for example.

The first sub-block pattern 360 may be disposed in the peripheral region 20 on the insulating interlayer 190. The first sub-block pattern 360 may overlap a portion of the power supply wire 380. In such an embodiment, the first sub-block pattern 360 may block a leakage of the second TFE layer 452, and may be located in a same layer as the planarization layer 270. The first sub-block pattern 360 may include an organic material or an inorganic material. In an exemplary embodiment, the first sub-block pattern 360 may include an organic material.

The lower electrode 290 may be disposed in the sub-pixel region 30 on the planarization layer 270. In one exemplary embodiment, for example, the lower electrode 290 may include at least one selected from a metal, an alloy of a metal, a metal nitride, a conductive metal oxide and a transparent conductive material, for example. These materials may be used alone or in a suitable combination thereof. Alternatively, the lower electrode 290 may have a multi-layered structure including a plurality of layers.

The connection pattern 295 may be disposed in the peripheral region 20 on a portion of the planarization layer 270, the power supply wire 380, and a portion of an upper surface of the first sub-block pattern 360. In such an embodiment, the connection pattern 295 may be spaced apart from the lower electrode 290 on the planarization layer 270, and may extend in the third direction D3. In such an embodiment, the connection pattern 295 may be disposed along a profile of the planarization layer 270, the power supply wire 380, and the first sub-block pattern 360. The connection pattern 295 may be interposed between the first block pattern 345 and the power supply wire 380 in the peripheral region 20, and a portion of the connection pattern 295 may be interposed between the first sub-block pattern 360 and the second sub-block pattern 370. Alternatively, the connection pattern 295 might not be disposed on the upper surface of the first sub-block pattern 360. The connection pattern 295 may electrically connect the power supply wire 380 and the upper electrode 340, and may receive the low power supply voltage ELVSS from the power supply wire 380. The low power supply voltage ELVSS may be applied to the upper electrode 340 through the connection pattern 295. The connection pattern 295 may include at least one selected from a metal, an alloy of a metal, a metal nitride, a conductive metal oxide and a transparent conductive material, for example. These materials may be used alone or in a suitable combination thereof. Alternatively, the connection pattern 295 may have a multi-layered structure including a plurality of layers.

The pixel defining layer 310 may be disposed on a portion of the lower electrode 290, a portion of the connection pattern 295, and the planarization layer 270. The pixel defining layer 310 may cover lateral portions of the lower electrode 290, and an opening that exposes a portion of an upper surface of the lower electrode 290 is defined through the pixel defining layer 310. The pixel defining layer 310 may include an organic material or an inorganic material. In an exemplary embodiment, the pixel defining layer 310 may include an organic material.

The light emitting layer 330 may be disposed on the lower electrode 290 exposed by the opening of the pixel defining layer 310. The light emitting layer 330 may include or be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In an exemplary embodiment, a color filter may be disposed on the light emitting layer 330 (e.g., to overlap the light emitting layer 330 on an upper surface of the TFE structure 450). The color filter may include at least one selected from a red color filter, a green color filter, and a blue color filter. Alternatively, the color filter may include at least one selected from a yellow color filter, a cyan color filter, and a magenta color filter. The color filter may include at least one selected from a photosensitive resin and a color photoresist, for example.

The first block pattern 345 may be disposed in the peripheral region 20 on the connection pattern 295. In such an embodiment, the first block pattern 345 may be disposed on the connection pattern 295 under which the power supply wire 380 is located. In one exemplary embodiment, for example, the first block pattern 345 may surround the display region 10 (or the sub-pixel region 30). In an exemplary embodiment, the first block pattern 345 may block a leakage of the second TFE layer 452. The first block pattern 345 may include an organic material or an inorganic material. In an exemplary embodiment, the first block pattern 345 may include an organic material.

The second sub-block pattern 370 may be disposed on the first sub-block pattern 360 and a portion of the connection pattern 295. In an exemplary embodiment, the second sub-block pattern 370 together with the first sub-block pattern 360 may block a leakage of the second TFE layer 452. In an exemplary embodiment, the second sub-block pattern 370 may include an organic material.

Accordingly, the second block pattern 350 including the first sub-block pattern 360 and the second sub-block pattern 370 may be disposed. In one exemplary embodiment, for example, the second block pattern 350 may be spaced apart from the first block pattern 345, and may surround the first block pattern 345. A height of the second block pattern 350 may be greater than a height of the first block pattern 345. In an exemplary embodiment, the first block pattern 345 and the second block pattern 350 may collectively define the block structure 400. In an exemplary embodiment, the block structure 400 may be disposed at an outmost portion of the peripheral region 20 on the substrate 110.

The upper electrode 340 may be disposed on the pixel defining layer 310 and the light emitting layer 330. The upper electrode 340 may cover the light emitting layer 330 and the pixel defining layer 310, and may be disposed on the entire substrate 110. In an exemplary embodiment, the upper electrode 340 may cover the light emitting layer 330 and extend in the third direction D3, and may be electrically connected to the connection pattern 295. The upper electrode 340 may include at least one selected from a metal, a metal alloy, a metal nitride, a conductive metal oxide and a transparent conductive material, for example. These materials may be used alone or in a suitable combination thereof. Alternatively, the upper electrode 340 may have a multi-layered structure including a plurality of layers. Accordingly, the sub-pixel structure 200 including the lower electrode 290, the light emitting layer 330, and the upper electrode 340 may be disposed on the planarization layer 270.

The first TFE layer 451 may be disposed on the upper electrode 340, the connection pattern 295, the block structure 400, and the insulating interlayer 190. The first TFE layer 451 may cover the upper electrode 340, the connection pattern 295, and the block structure 400, and may be disposed as a substantially uniform thickness along a profile of the upper electrode 340, the connection pattern 295, and the block structure 400. The first TFE layer 451 may prevent the sub-pixel structure 200 from being deteriorated by the permeation of moisture, water, oxygen, etc. In such an embodiment, the first TFE layer 451 may protect the sub-pixel structure 200 from external impacts. The first TFE layer 451 may include an inorganic material having flexibility.

The second TFE layer 452 may be disposed on the first TFE layer 451. The second TFE layer 452 may improve the flatness of the OLED display device 100, and may protect the sub-pixel structure 200. The second TFE layer 452 may include an organic material having flexibility.

The third TFE layer 453 may be disposed on the second TFE layer 452. The third TFE layer 453 may cover the second TFE layer 452, and may be disposed as a substantially uniform thickness along a profile of the second TFE layer 452. The third TFE layer 453 together with the first TFE layer 451 and the second TFE layer 452 may prevent the sub-pixel structure 200 from being deteriorated by the permeation of moisture, water, oxygen, etc. In such an embodiment, the third TFE layer 453 together with the first TFE layer 451 and the second TFE layer 452 may protect the sub-pixel structure 200 from external impacts. The third TFE layer 453 may include an inorganic material having flexibility. Accordingly, the TFE structure 450 including the first TFE layer 451, the second TFE layer 452, and the third TFE layer 453 may be disposed.

Alternatively, the TFE structure 450 may have five layers structure where first through fifth TFE layers are stacked one on another, or seven layers structure where the first through seventh TFE layers are stacked one on another.

In an exemplary embodiment, the OLED display device includes the first signal wire 710 and the second signal wire 510 that are disposed to overlap the first circuit structure 800 and the second circuit structure 600, such that the OLED display device 100 may relatively reduce a width of a bezel corresponding to a non-display region or may relatively increase an area of the display region 10.

Alternatively, a gate signal wire, an initialization voltage wire, an initialization signal wire, etc. may be further disposed between the substrate 110 and the buffer layer 115.

FIGS. 6 through 11 are cross-sectional views illustrating a method of manufacturing an OLED display device in accordance with an exemplary embodiment.

Referring to FIG. 6, a rigid glass substrate 105 may be provided. A first organic layer 111 may be provided or formed on the rigid glass substrate 105. The first organic layer 111 may be provided or formed on the entire rigid glass substrate 105, and may be formed using an organic material having flexibility such as polyimide.

A first barrier layer 112 may be provided or formed on the entire first organic layer 111. The first barrier layer 112 may block moisture or water that is permeated through the first organic layer 111. The first barrier layer 112 may be formed using an inorganic material having flexibility such as silicon oxide, silicon nitride, etc.

A second organic layer 113 may be provided or formed on the first barrier layer 112. The second organic layer 113 may be provided or formed on the entire first barrier layer 112, and may be formed using an organic material having flexibility such as polyimide, for example.

A second barrier layer 114 may be provided or formed on the entire second organic layer 113. The second barrier layer 114 may block moisture or water that is permeated through the second organic layer 113. The second barrier layer 114 may be formed using an inorganic material having flexibility such as silicon oxide, silicon nitride, etc.

Since the substrate 110 are relatively thin and flexible, the substrate 110 may be provided or formed on a rigid glass substrate 105 to help support a formation of the upper structure (e.g., a first signal wire, a second signal wire, a transistors, a sub-pixel structure, etc.). In one exemplary embodiment, for example, after the upper structure is provided or formed on the substrate 110, the rigid glass substrate 105 may be removed. In such an embodiment, it may be difficult to directly form the upper structure on the first and second organic layers 111 and 113 and the first and second barrier layers 112 and 114 because the first and second organic layers 111 and 113 and the first and second barrier layers 112 and 114 are relatively thin and flexible. Accordingly, the upper structure is provided or formed on the substrate 110 and the rigid glass substrate, and then the first and second organic layers 111 and 113 and the first and second barrier layers 112 and 114 may serve as the substrate 110 after removing the rigid glass substrate 105.

In an exemplary embodiment, the substrate 110 includes four layers, but not being limited thereto. In one exemplary embodiment, for example, the substrate 110 may include a single layer or at least two layers.

A first signal wire 710 may be provided or formed in the peripheral region 20 on the substrate 110 (e.g., the second barrier layer 114). The first signal wire 710 may be provided or formed adjacent to a boundary of the peripheral region 20 and the sub-pixel region 30. A second signal wire 510 may be provided or formed in the peripheral region 20 on the substrate 110, and may be spaced apart from the first signal wire 710.

Each of the first signal wire 710 and the second signal wire 510 may be formed using at least one selected from a metal, an alloy of a metal, a metal a nitride, a conductive metal oxide and a transparent conductive material, for example. In one exemplary embodiment, for example, each of the first signal wire 710 and the second signal wire 510 may include at least one selected from Au, Ag, Al, W, Cu, Pt, Ni, Ti, Pd, Mg, Ca, Li, Cr, Ta, Mo, Sc, Nd, Ir, an alloy of aluminum, AlN, an alloy of silver, WN, an alloy of copper, an alloy of molybdenum, TiN, CrN, TaN, SrRuO, ZnO, ITO, SnO, InO, GaO, IZO, etc. These materials may be used alone or in a suitable combination thereof. Alternatively, each of the first signal wire 710 and the second signal wire 510 may have a multi-layered structure including a plurality of layers. In an exemplary embodiment, each of the first signal wire 710 and the second signal wire 510 may essentially consist of super aluminium metal. In an exemplary embodiment, the first signal wire 710 and the second signal wire 510 may be simultaneously (or concurrently) formed using a same material as each other. In one exemplary embodiment, for example, after a preliminary signal wire layer is provided or formed on the entire second barrier layer 114, the first signal wire 710 and the second signal wire 510 may be formed by selectively etching the preliminary signal wire layer.

Figure 7:
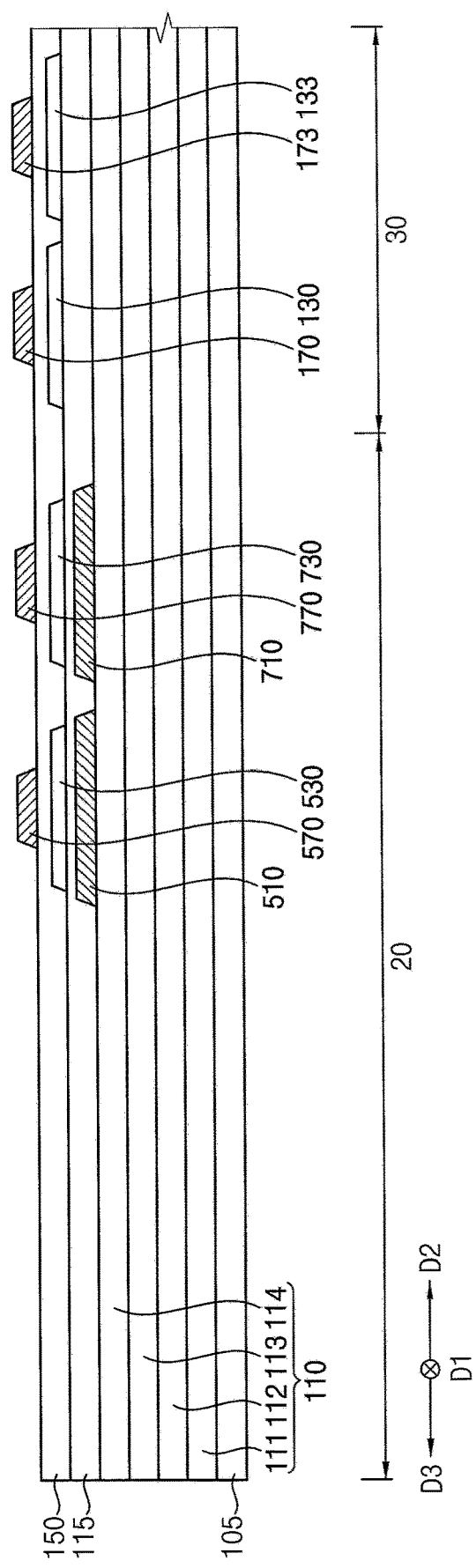

Referring to FIG. 7, a buffer layer 115 may be provided or formed on the substrate 110, the first signal wire 710, and the second signal wire 510. The buffer layer 115 may cover the first signal wire 710 and the second signal wire 510 in the peripheral region 20 on the substrate 110, and may extend in the first direction D1. In such an embodiment, the buffer layer 115 may be provided or formed on the entire substrate 110. In one exemplary embodiment, for example, the buffer layer 115 may sufficiently cover the first and second signal wires 710 and 510, and may have a substantially flat upper surface without a step around the first and second signal wires 710 and 510. Alternatively, the buffer layer 115 may cover the first and second signal wires 710 and 510 on the substrate 110, and may be formed as a substantially uniform thickness along a profile of the first and second signal wires 710 and 510.

According to a type of the substrate 110, at least two buffer layers 115 may be provided on the substrate 110, or the buffer layer 115 may be omitted. In one exemplary embodiment, for example, the buffer layer 115 may include an organic material or an inorganic material. In an exemplary embodiment, the buffer layer 115 may be formed using an inorganic material.

A first active pattern 730 and a second active pattern 530 may be provided or formed in the peripheral region 20 on the buffer layer 115, and may be spaced apart from each other. A first active layer 130 and a second active layer 133 may be provided or formed in the sub-pixel region 30 on the buffer layer 115, and may be spaced apart from each other. In an exemplary embodiment, the first active pattern 730 may be formed to partially overlap the first signal wire 710, and the second active pattern 530 may be formed to partially overlap the second signal wire 510. Each of the first active pattern 730, the second active pattern 530, the first active layer 130, and the second active layer 133 may be formed using at least one selected from a metal oxide semiconductor, an inorganic semiconductor, an organic semiconductor, etc. In an exemplary embodiment, the first active pattern 730, the second active pattern 530, the first active layer 130, and the second active layer 133 may be simultaneously formed using a same material as each other. In one exemplary embodiment, for example, after a preliminary active layer is provided or formed on the entire buffer layer 115, the first active pattern 730, the second active pattern 530, the first active layer 130, and the second active layer 133 may be formed by selectively etching the preliminary active layer.

A gate insulation layer 150 may be provided or formed on the buffer layer 115, the first and second active patterns 730 and 530, and the first and second active layers 130 and 133. The gate insulation layer 150 may cover the first and second active patterns 730 and 530 in the peripheral region 20 and the first and second active layers 130 and 133 in the sub-pixel region 30 on the buffer layer 115, and may extend in the first direction D1. That is, the gate insulation layer 150 may be provided or formed on the entire buffer layer 115. In one exemplary embodiment, for example, the gate insulation layer 150 may sufficiently cover the first and second active patterns 730 and 530 and the first and second active layers 130 and 133 on the buffer layer 115, and may have a substantially flat upper surface without a step around the first and second active patterns 730 and 530 and the first and second active layers 130 and 133. Alternatively, the gate insulation layer 150 may cover the first and second active patterns 730 and 530 and the first and second active layers 130 and 133 on the buffer layer 115, and may be formed as a substantially uniform thickness along a profile of the first and second active patterns 730 and 530 and the first and second active layers 130 and 133. The gate insulation layer 150 may be formed using a silicon compound or a metal oxide, for example. In one exemplary embodiment, for example, the gate insulation layer 150 may include at least one selected from SiO, SiN, SiON, SiOC, SiCN, AlO, AlN, TaO, HfO, ZrO, TiO, etc.

A first gate electrode pattern 770 and the second gate electrode pattern 570 may be provided or formed in the peripheral region 20 on the gate insulation layer 150, and may be spaced apart from each other. The first gate electrode 170 and the second gate electrode 173 may be provided or formed in the sub-pixel region 30 on the gate insulation layer 150, and may be spaced apart from each other. In one exemplary embodiment, for example, the first gate electrode pattern 770 may be provided or formed on the gate insulation layer 150 under which the first active pattern 730 is located, and the second gate electrode pattern 570 may be provided or formed on the gate insulation layer 150 under which the second active pattern 530 is located. The first gate electrode 170 may be provided or formed on the gate insulation layer 150 under which the first active layer 130 is located, and the second gate electrode 173 may be provided or formed on the gate insulation layer 150 under which the second active layer 133 is located. Each of the first and second gate electrode patterns 770 and 570 and the first and second gate electrodes 170 and 173 may be formed using at least one selected from a metal, an alloy of a metal, a metal nitride, a conductive metal oxide and a transparent conductive materials, for example. These materials may be used alone or in a suitable combination thereof. Alternatively, each of the first and second gate electrode patterns 770 and 570 and the first and second gate electrodes 170 and 173 may have a multi-layered structure including a plurality of layers. In an exemplary embodiment, the first and second gate electrode patterns 770 and 570 and the first and second gate electrodes 170 and 173 may be simultaneously formed using a same material as each other. In one exemplary embodiment, for example, after a preliminary first electrode layer is provided or formed on the entire gate insulation layer 150, the first and second gate electrode patterns 770 and 570 and the first and second gate electrodes 170 and 173 may be formed by selectively etching the preliminary first electrode layer.

Figure 8:
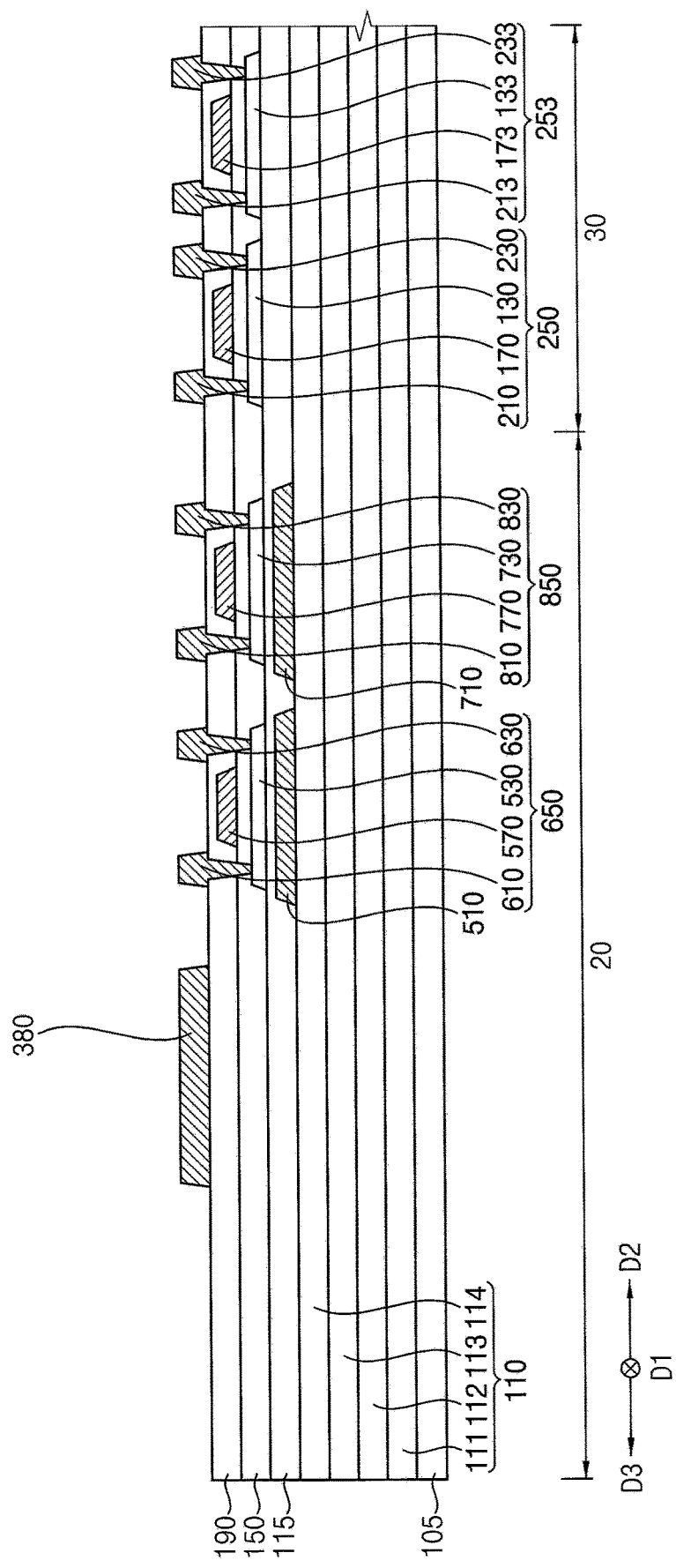

Referring to FIG. 8, an insulating interlayer 190 may be provided or formed on the gate insulation layer 150, the first and second gate electrode patterns 770 and 570, and the first and second gate electrodes 170 and 173. The insulating interlayer 190 may cover the first and second gate electrode patterns 770 and 570 in the peripheral region 20 and the first and second gate electrodes 170 and 173 in the sub-pixel region 30 on the gate insulation layer 150, and may extend in the first direction D1. That is, the insulating interlayer 190 may be provided or formed on the entire gate insulation layer 150. In one exemplary embodiment, for example, the insulating interlayer 190 may sufficiently cover the first and second gate electrode patterns 770 and 570 and the first and second gate electrodes 170 and 173 on the gate insulation layer 150, and may have a substantially flat upper surface without a step around the first and second gate electrode patterns 770 and 570 and the first and second gate electrodes 170 and 173. Alternatively, the insulating interlayer 190 may cover the first and second gate electrode patterns 770 and 570 and the first and second gate electrodes 170 and 173 on the gate insulation layer 150, and may be formed as a substantially uniform thickness along a profile of the first and second gate electrode patterns 770 and 570 and the first and second gate electrodes 170 and 173. The insulating interlayer 190 may be formed using a silicon compound or a metal oxide, for example.

A first source electrode pattern 810, a first drain electrode pattern 830, a second source electrode pattern 610, and a second drain electrode pattern 630 may be provided or formed in the peripheral region 20 on the insulating interlayer 190, and may be spaced apart from each other. A first source electrode 210, a first drain electrode 230, a second source electrode 213, and a second drain electrode 233 may be provided or formed in the sub-pixel region 30 on the insulating interlayer 190, and may be spaced apart from each other.

The first source electrode pattern 810 may be in contact with a source region of the first active pattern 730 via a contact hole formed by removing a first portion of the gate insulation layer 150 and the insulating interlayer 190, and the first drain electrode pattern 830 may be in contact with a drain region of the first active pattern 730 via a contact hole formed by removing a second portion of the gate insulation layer 150 and the insulating interlayer 190. The second source electrode pattern 610 may be in contact with a source region of the second active pattern 530 via a contact hole formed by removing a third portion of the gate insulation layer 150 and the insulating interlayer 190, and the second drain electrode pattern 630 may be in contact with a drain region of the second active pattern 530 via a contact hole formed by removing a fourth portion of the gate insulation layer 150 and the insulating interlayer 190.

The first source electrode 210 may be in contact with a source region of the first active layer 130 via a contact hole formed by removing a fifth portion of the gate insulation layer 150 and the insulating interlayer 190, and the first drain electrode 230 may be in contact with a drain region of the first active layer 130 via a contact hole formed by removing a sixth portion of the gate insulation layer 150 and the insulating interlayer 190. The second source electrode 213 may be in contact with a source region of the second active layer 133 via a contact hole formed by removing a seventh portion of the gate insulation layer 150 and the insulating interlayer 190, and the second drain electrode 233 may be in contact with a drain region of the second active layer 133 via a contact hole formed by removing an eighth portion of the gate insulation layer 150 and the insulating interlayer 190.

Accordingly, a first transistor 850 including the first active pattern 730, the first gate electrode pattern 770, the first source electrode pattern 810, and the first drain electrode pattern 830 may be formed, and a second transistor 650 including the second active pattern 530, the second gate electrode pattern 570, the second source electrode pattern 610, and the second drain electrode pattern 630 may be provided or formed on the buffer layer 115. Here, the second transistor 650 may be spaced apart from the first transistor 850 by the third direction D3. In addition, a switching transistor 250 including the first active layer 130, the first gate electrode 170, the first source electrode 210, and the first drain electrode 230 may be formed, and a driving transistor 253 including the second active layer 133, the second gate electrode 173, the second source electrode 213, and the second drain electrode 233 may be provided or formed on the buffer layer 115. Here, the driving transistor 253 may be spaced apart from the switching transistor 250 by the second direction D2.

A power supply wire 380 may be provided or formed in the peripheral region 20 on the insulating interlayer 190. In an exemplary embodiment, the power supply wire 380 may be spaced apart from the first source and first drain electrode patterns 810 and 830 and the second source and second drain electrode patterns 610 and 630.

Each of the first source and first drain electrode patterns 810 and 830, the second source and second drain electrode patterns 610 and 630, the first source and first drain electrodes 210 and 230, the second source and second drain electrodes 213 and 233, and the power supply wire 380 may be formed using at least one selected from a metal, an alloy of a metal, a metal nitride, a conductive metal oxide and a transparent conductive material, for example. These materials may be used alone or in a suitable combination thereof. Alternatively, each of the first source and first drain electrode patterns 810 and 830, the second source and second drain electrode patterns 610 and 630, the first source and first drain electrodes 210 and 230, the second source and second drain electrodes 213 and 233, and the power supply wire 380 may have a multi-layered structure including a plurality of layers. In an exemplary embodiment, the first source and first drain electrode patterns 810 and 830, the second source and second drain electrode patterns 610 and 630, the first source and first drain electrodes 210 and 230, the second source and second drain electrodes 213 and 233, and the power supply wire 380 may be simultaneously formed using a same material as each other. In one exemplary embodiment, for example, after preliminary second electrode layer is provided or formed on the entire insulating interlayer 190, each of the first source and first drain electrode patterns 810 and 830, the second source and second drain electrode patterns 610 and 630, the first source and first drain electrodes 210 and 230, the second source and second drain electrodes 213 and 233, and the power supply wire 380 may be formed by selectively etching the preliminary second electrode layer.

Figure 9:
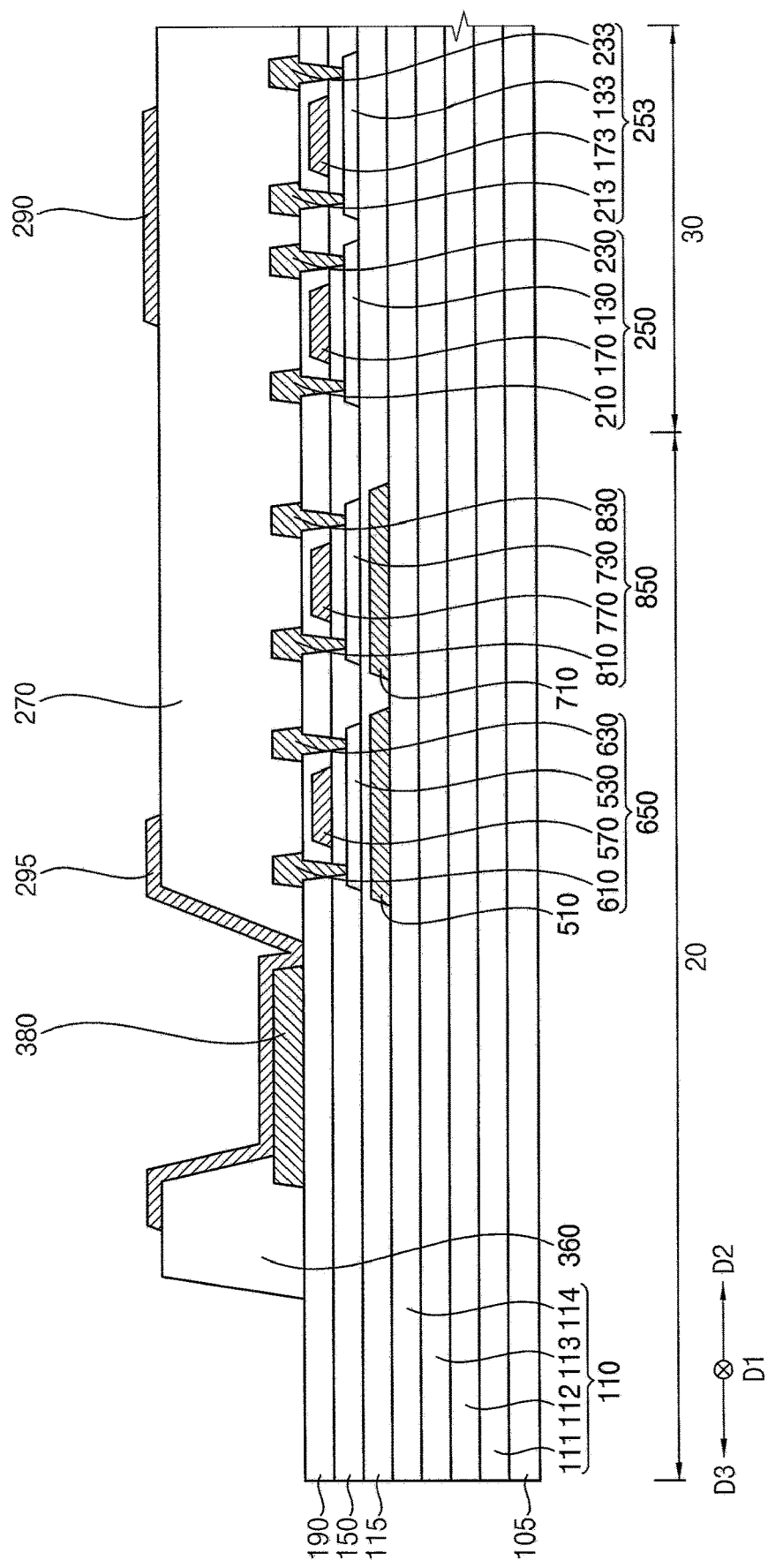

Referring to FIG. 9, a planarization layer 270 may be provided or formed on the insulating interlayer 190, the power supply wire 380, the first source and first drain electrode patterns 810 and 830, the second source and second drain electrode patterns 610 and 630, the first source and first drain electrodes 210 and 230, and the second source and second drain electrodes 213 and 233. The planarization layer 270 may be formed as a high thickness to sufficiently cover the power supply wire 380, the first source and first drain electrode patterns 810 and 830, the second source and second drain electrode patterns 610 and 630, the first source and first drain electrodes 210 and 230, and the second source and second drain electrodes 213 and 233 on the insulating interlayer 190. In such an embodiment, the planarization layer 270 may have a substantially flat upper surface, and a planarization process may be further performed on the planarization layer 270 to implement the flat upper surface of the planarization layer 270. The planarization layer 270 may include an organic material or an inorganic material. In an exemplary embodiment, the planarization layer 270 may be formed using an organic material such as photoresist, polyacryl-based resin, polyimide-based resin, a polyamide-based resin, a siloxane-based resin, acryl-based resin or epoxy-based resin, for example.

A first sub-block pattern 360 may be provided or formed in the peripheral region 20 on the insulating interlayer 190. The first sub-block pattern 360 may overlap a portion of the power supply wire 380. In such an embodiment, the first sub-block pattern 360 may be located in a same layer as the planarization layer 270. In one exemplary embodiment, for example, after a preliminary first organic insulation layer is provided or formed on the entire insulating interlayer 190, the first sub-block pattern 360 and the planarization layer 270 may be formed by partially etching the preliminary first organic insulation layer.

A lower electrode 290 may be provided or formed in the sub-pixel region 30 on the planarization layer 270. In one exemplary embodiment, for example, the lower electrode 290 may be formed using at least one selected from a metal, an alloy of a metal, a metal nitride, a conductive metal oxide and a transparent conductive material, for example. These materials may be used alone or in a suitable combination thereof. Alternatively, the lower electrode 290 may have a multi-layered structure including a plurality of layers.

A connection pattern 295 may be provided or formed on a portion of the planarization layer 270, the power supply wire 380, and a portion of an upper surface of the first sub-block pattern 360. In such an embodiment, the connection pattern 295 may be spaced apart from the lower electrode 290 on the planarization layer 270, and may extend in the third direction D3. In such an embodiment, the connection pattern 295 may be formed along a profile of the planarization layer 270, the power supply wire 380, and the first sub-block pattern 360. The connection pattern 295 and the lower electrode 290 may be simultaneously formed using a same material as each other. In one exemplary embodiment, for example, after a preliminary third electrode layer is entirely provided or formed on the insulating interlayer 190, the first sub-block pattern 360, the power supply wire 380, and the planarization layer 270, the connection pattern 295 and the lower electrode 290 may be formed by partially etching the preliminary third electrode layer. Alternatively, the connection pattern 295 may have a multi-layered structure including a plurality of layers.

Figure 10:
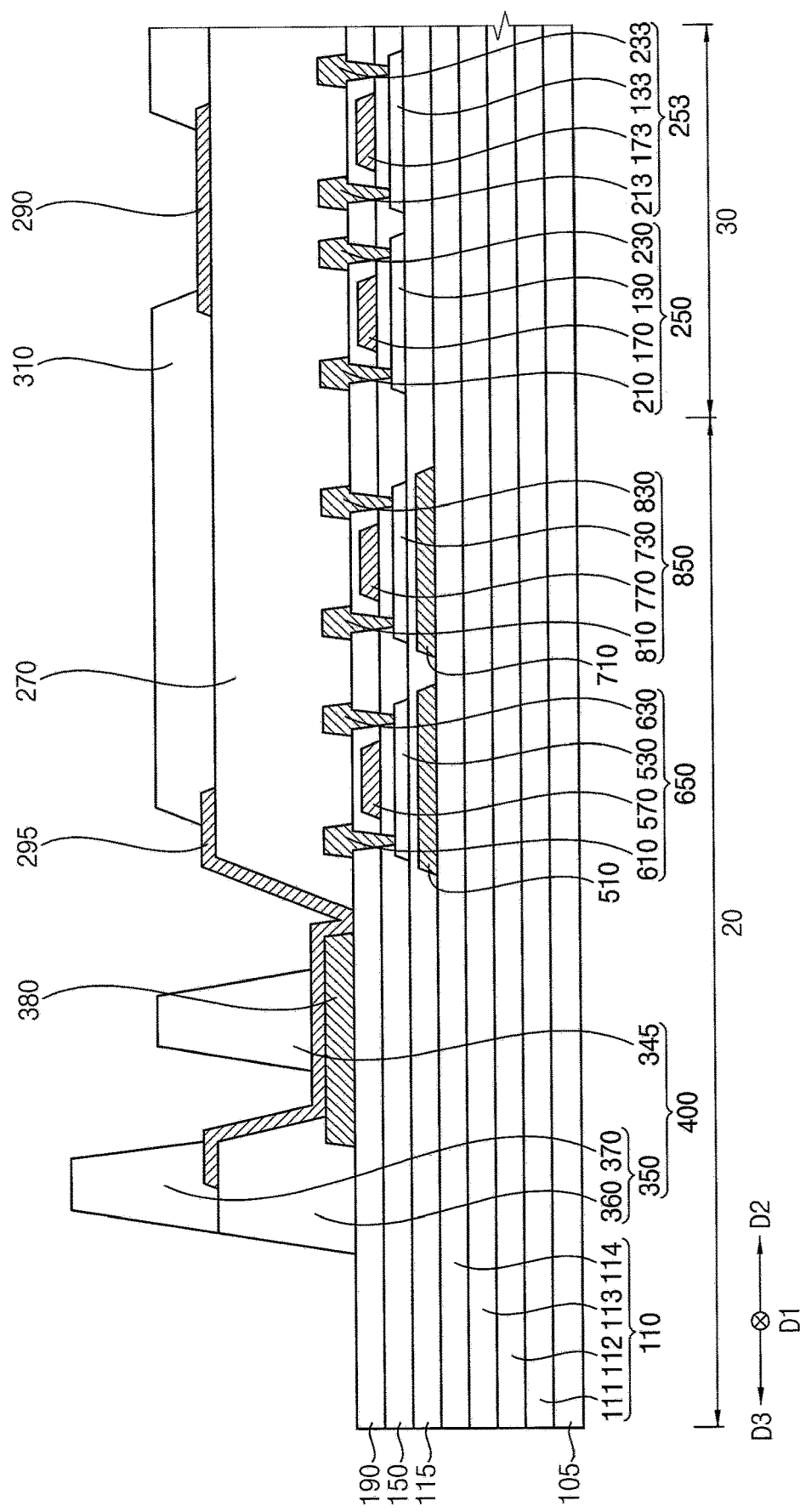

Referring to FIG. 10, a pixel defining layer 310 may be provided or formed on a portion of the lower electrode 290, a portion of the connection pattern 295, and the planarization layer 270. The pixel defining layer 310 may cover both lateral portions of the lower electrode 290, and may have an opening that exposes a portion of an upper surface of the lower electrode 290. The pixel defining layer 310 may be formed using an organic material.

A first block pattern 345 may be provided or formed in the peripheral region 20 on the connection pattern 295. In such an embodiment, the first block pattern 345 may be provided or formed on the connection pattern 295 under which the power supply wire 380 is located. In one exemplary embodiment, for example, the first block pattern 345 may surround the display region 10. The first block pattern 345 may be formed using an organic material.

A second sub-block pattern 370 may be provided or formed on the first sub-block pattern 360 and a portion of the connection pattern 295. In such an embodiment, the second sub-block pattern 370 may be formed using an organic material. In an exemplary embodiment, the pixel defining layer 310, the first block pattern 345, and the second sub-block pattern 370 may be simultaneously formed using a same material as each other. In one exemplary embodiment, for example, after a preliminary second organic layer is formed entirely on the insulating interlayer 190, the first sub-block pattern 360, the connection pattern 295, and the planarization layer 270, the pixel defining layer 310, the first block pattern 345, and the second sub-block pattern 370 may be formed by partially etching (e.g., a etch process using a half hone mask or a silt mask) the preliminary second organic layer.

Accordingly, a second block pattern 350 including the first sub-block pattern 360 and the second sub-block pattern 370 may be formed. In one exemplary embodiment, for example, the second block pattern 350 may be spaced apart from the first block pattern 345, and may surround the first block pattern 345. A height of the second block pattern 350 may be greater than a height of the first block pattern 345. In such an embodiment, the first block pattern 345 and the second block pattern 350 may collectively define a block structure 400.

Figure 11:
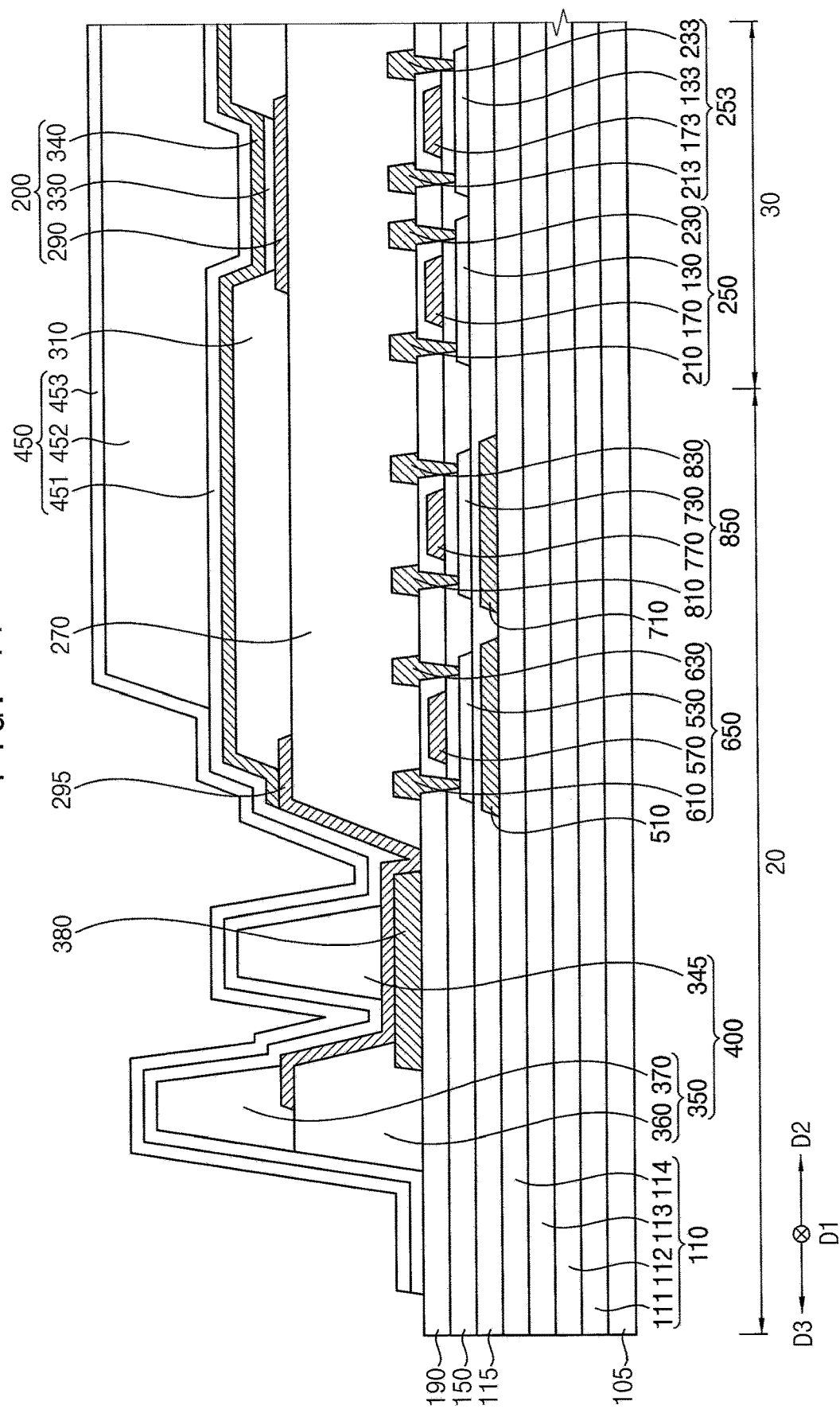

Referring to FIG. 11, a light emitting layer 330 may be provided or formed on the lower electrode 290 exposed by the opening of the pixel defining layer 310. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be provided or formed on the light emitting layer 330. The color filter may include at least one selected from a red color filter, a green color filter, and a blue color filter. Alternatively, the color filter may include at least one selected from a yellow color filter, a cyan color filter, and a magenta color filter. The color filter may be formed using at least one selected from a photosensitive resin and a color photoresist, for example.

An upper electrode 340 may be provided or formed on the pixel defining layer 310 and the light emitting layer 330. The upper electrode 340 may cover the light emitting layer 330 and the pixel defining layer 310, and may be provided or formed on the entire substrate 110. In an exemplary embodiment, the upper electrode 340 may cover the light emitting layer 330 and extend in the third direction D3, and may be electrically connected to the connection pattern 295. The upper electrode 340 may be formed using at least one selected from a metal, a metal alloy, a metal nitride, a conductive metal oxide and a transparent conductive material, for example. These materials may be used alone or in a suitable combination thereof. Alternatively, the upper electrode 340 may have a multi-layered structure including a plurality of layers. Accordingly, a sub-pixel structure 200 including the lower electrode 290, the light emitting layer 330, and the upper electrode 340 may be formed.

A first TFE layer 451 may be provided or formed on the upper electrode 340, the connection pattern 295, the block structure 400, and the insulating interlayer 190. The first TFE layer 451 may cover the upper electrode 340, the connection pattern 295, and the block structure 400, and may be formed as a substantially uniform thickness along a profile of the upper electrode 340, the connection pattern 295, and the block structure 400. The first TFE layer 451 may prevent the sub-pixel structure 200 from being deteriorated by the permeation of moisture, water, oxygen, etc. In such an embodiment, the first TFE layer 451 may protect the sub-pixel structure 200 from external impacts. The first TFE layer 451 may be formed using an inorganic material having flexibility.

A second TFE layer 452 may be provided or formed on the first TFE layer 451. The second TFE layer 452 may improve the flatness of the OLED display device, and may protect the sub-pixel structure 200. The second TFE layer 452 may be formed using an organic material having flexibility.

A third TFE layer 453 may be provided or formed on the second TFE layer 452. The third TFE layer 453 may cover the second TFE layer 452, and may be formed as a substantially uniform thickness along a profile of the second TFE layer 452. The third TFE layer 453 together with the first TFE layer 451 and the second TFE layer 452 may prevent the sub-pixel structure 200 from being deteriorated by the permeation of moisture, water, oxygen, etc. In such an embodiment, the third TFE layer 453 together with the first TFE layer 451 and the second TFE layer 452 may protect the sub-pixel structure 200 from external impacts. The third TFE layer 453 may be formed using an inorganic material having flexibility. Accordingly, a TFE structure 450 including the first TFE layer 451, the second TFE layer 452, and the third TFE layer 453 may be formed. Alternatively, the TFE structure 450 may have five layers structure where first through fifth TFE layers are stacked one on another, or seven layers structure where the first through seventh TFE layers are stacked one on another. After the TFE structure 450 is formed, the rigid glass substrate 105 may be removed from the substrate 110.

Accordingly, an OLED display device 100 illustrated in FIG. 4 may be manufactured.

Figure 12:
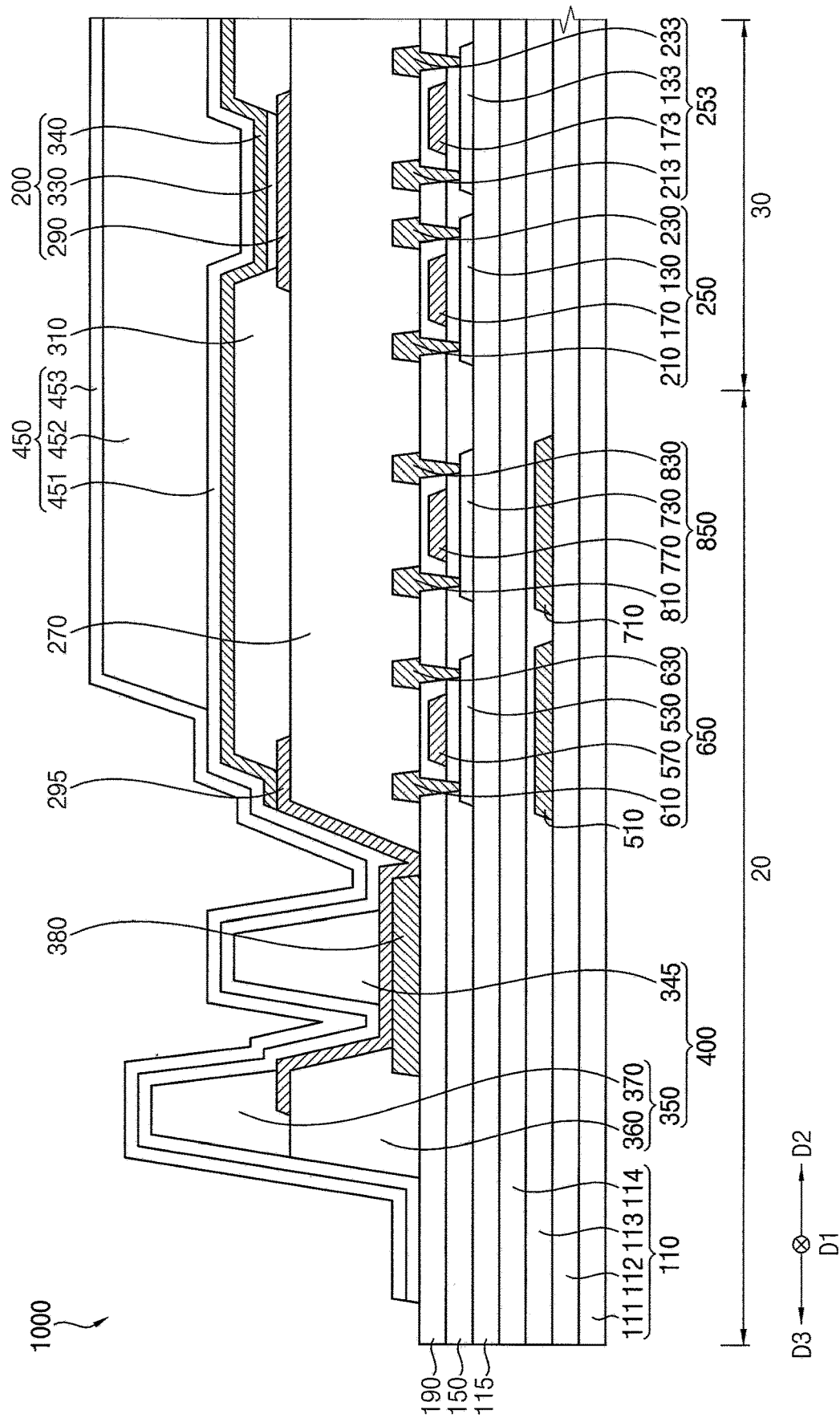
FIG. 12 is a cross-sectional view illustrating an OLED display device in accordance with an alternative exemplary embodiment.

FIG. 12 is a cross-sectional view illustrating an OLED display device in accordance with an alternative exemplary embodiment. An OLED display device 1000 illustrated in FIG. 12 may have a configuration substantially the same as or similar to that of an OLED display device 100 described with reference to FIGS. 1 through 4 except for a location of a first signal wire 710 and a second signal wire 510 each. In FIG. 12, any repetitive detailed descriptions for elements that are substantially the same as or similar to elements described with reference to FIGS. 1 through 4 will be omitted or simplified.

Referring to FIG. 12, an exemplary embodiment of an OLED display device 1000 may include a substrate 110, a buffer layer 115, a first signal wire 710, a second signal wire 510, a first circuit structure 800, a second circuit structure 600, a gate insulation layer 150, an insulating interlayer 190, a power supply wire 380, a switching transistor 250, a driving transistor 253, a planarization layer 270, a block structure 400, a sub-pixel structure 200, a connection pattern 295, a pixel defining layer 310, a thin film encapsulation ("TFE") structure 450, etc. Here, the substrate 110 may include a first organic layer 111, a first barrier layer 112, a second organic layer 113, and a second barrier layer 114.

In such an embodiment, the first signal wire 710 may be disposed in the peripheral region 20 on the first barrier layer 112. In such an embodiment, the first signal wire 710 may be disposed in the peripheral region 20 between the first barrier layer 112 and the second organic layer 113, and may partially overlap the first transistor 850. The first signal wire 710 may be disposed adjacent to a boundary of the peripheral region 20 and the sub-pixel region 30. In an exemplary embodiment, the first signal wire 710 may be a clock signal wire, and may receive a clock signal generated from an external device 101.

In such an embodiment the second signal wire 510 may be disposed in the peripheral region 20 on the first barrier layer 112, and may be spaced apart from the first signal wire 710. In such an embodiment, the second signal wire 510 may be spaced apart from the first signal wire 710 by a third direction D3 in the peripheral region 20 between the first barrier layer 112 and the second organic layer 113, and may partially overlap the second transistor 650. In an exemplary embodiment, the second signal wire 510 may be a first driving power supply VDD, and may receive a first driving power supply VDD generated from the external device 101.

In an exemplary embodiment, the first signal wire 710 and the second signal wire 510 may be disposed within the substrate 110. In other words, the substrate 110 may include a plurality of layers, and the first signal wire 710 and the second signal wire 510 may be interposed between the layers.

In an exemplary embodiment, the OLED display device 1000 includes the first signal wire 710 and the second signal wire 510 that are disposed within the substrate 110 and under the first circuit structure 800 and the second circuit structure 600, such that an area of the peripheral region 20 of the OLED display device 1000 may be relatively reduced.

Exemplary embodiments of the invention may be applied to various display devices including an OLED display device, e.g., vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to a specific exemplary embodiment disclosed, and that modifications to the disclosed exemplary embodiments, as well as other exemplary embodiments, are intended to be included within the scope of the appended claims.

What is claimed is:

1. An organic light emitting diode display device, comprising:
   a substrate including:
      a display region including a plurality of sub-pixel regions; and
      a peripheral region surrounding the display region;
   a buffer layer in the display region and peripheral region on the substrate;
   a first circuit structure in the peripheral region on the buffer layer;
   a sub-pixel structure in each of the sub-pixel regions on the first circuit structure; and
   a first signal wire in the peripheral region between the substrate and the buffer layer, wherein the first signal wire overlaps the first circuit structure when viewed from a plan view in a thickness direction of the substrate.

2. The organic light emitting diode display device of claim 1, further comprising:
   a switching transistor disposed in the sub-pixel region on the buffer layer; and
   a driving transistor spaced apart from the switching transistor.

3. The organic light emitting diode display device of claim 2, wherein the switching transistor includes:
   a first active layer disposed in the sub-pixel region on the substrate;
   a first gate electrode disposed on the first active layer; and
   first source and first drain electrodes disposed on the first gate electrode.

4. The organic light emitting diode display device of claim 3, wherein the driving transistor includes:
   a second active layer spaced apart from the first active layer;
   a second gate electrode disposed on the second active layer; and
   second source and second drain electrodes disposed on the second gate electrode.

5. The organic light emitting diode display device of claim 4, wherein the first circuit structure includes a gate driver including a first transistor.

6. The organic light emitting diode display device of claim 5 wherein the gate driver provides a gate signal to the first gate electrode of the switching transistor.

7. The organic light emitting diode display device of claim 4, further comprising:
a second circuit structure spaced apart from the first circuit structure in the peripheral region on the substrate.

8. The organic light emitting diode display device of claim 7, wherein the second circuit structure includes a light emission driver including a second transistor spaced apart from the first circuit structure.

9. The organic light emitting diode display device of claim 8, further comprising:
a second signal wire spaced apart from the first signal wire in the peripheral region between the substrate and the buffer layer,
wherein the second signal wire overlaps the second circuit structure when viewed from the plan view in the thickness direction of the substrate.

10. The organic light emitting diode display device of claim 9, wherein
the first signal wire includes a clock signal wire to which a clock signal is applied,
the first signal wire provides the clock signal to the first and second circuit structures,
the second signal wire includes a driving power supply wire to which a driving power supply is applied, and
the second signal wire provides the driving power supply to the first and second circuit structure.

11. The organic light emitting diode display device of claim 1, further comprising:
a power supply wire spaced apart from the first circuit structure in the peripheral region on the buffer layer; and
a connection pattern disposed on the power supply wire.

12. The organic light emitting diode display device of claim 11, wherein the power supply wire is electrically connected to the sub-pixel structure through the connection pattern.

13. The organic light emitting diode display device of claim 11, further comprising:
a block structure disposed in an outmost portion of the peripheral region on the substrate.

14. The organic light emitting diode display device of claim 13, wherein the block structure includes:
a first block pattern disposed on the connection pattern and
a second block pattern spaced apart from the first block pattern,
wherein the second block pattern surrounds the first block pattern.

15. The organic light emitting diode display device of claim 14, wherein the sub-pixel structure includes:
a lower electrode disposed on the substrate;
a light emitting layer disposed on the lower electrode; and
an upper electrode disposed on the light emitting layer,
wherein the upper electrode is electrically connected to the connection pattern.

16. The organic light emitting diode display device of claim 1, wherein the substrate includes:
a first organic layer;
a first barrier layer disposed on the first organic layer;
a second organic layer disposed on the first barrier layer; and
a second barrier layer disposed on the second organic layer.

17. The organic light emitting diode display device of claim 1, further comprising:
a thin film encapsulation structure disposed on the sub-pixel structure,
wherein the thin film encapsulation structure includes:
a first thin film encapsulation layer including an inorganic material having flexibility;
a second thin film encapsulation layer disposed on the first thin film encapsulation layer, wherein the second thin film encapsulation layer includes an organic material having flexibility; and
a third thin film encapsulation layer disposed on the second thin film encapsulation layer, wherein the third thin film encapsulation layer includes an inorganic material having flexibility.

\* \* \* \* \*